(12) United States Patent
Huitema

(10) Patent No.: US 9,954,033 B2
(45) Date of Patent: Apr. 24, 2018

(54) BONDING P-TYPE AND N-TYPE SHEETS TO FORM COMPLEMENTARY CIRCUITS

(71) Applicant: Polyera Corporation, Skokie, IL (US)

(72) Inventor: Hjalmar Edzer Ayco Huitema, Belmont, CA (US)

(73) Assignee: FLEXTERRA, INC., Skokie, IL (US)

( * ) Notice: Subject to any disclaimer, the term of this patent is extended or adjusted under 35 U.S.C. 154(b) by 0 days.

(21) Appl. No.: 15/375,118

(22) Filed: Dec. 11, 2016

(65) Prior Publication Data
US 2017/0236874 A1 Aug. 17, 2017

Related U.S. Application Data

(60) Provisional application No. 62/266,100, filed on Dec. 11, 2015.

(51) Int. Cl.
| | |
|---|---|
| *H01L 51/40* | (2006.01) |
| *H01L 27/28* | (2006.01) |
| *H01L 51/00* | (2006.01) |
| *H01L 51/05* | (2006.01) |
| H01L 29/786 | (2006.01) |

(52) U.S. Cl.
CPC .......... *H01L 27/283* (2013.01); *H01L 27/286* (2013.01); *H01L 51/0024* (2013.01); *H01L 51/0541* (2013.01); *H01L 29/78666* (2013.01)

(58) Field of Classification Search
CPC ............. H01L 51/0024; H01L 51/0541; H01L 51/0545; H01L 29/78666; H01L 29/78669; H01L 27/283; H01L 29/78642; H01L 25/0657; H01L 27/092–27/0928
See application file for complete search history.

(56) References Cited

U.S. PATENT DOCUMENTS

| | | | | |
|---|---|---|---|---|
| 5,585,675 A | * | 12/1996 | Knopf .................. | H01L 23/481 257/686 |
| 8,134,152 B2 | * | 3/2012 | Choi ...................... | H01L 27/12 257/340 |
| 2002/0113548 A1 | * | 8/2002 | Silvernail .......... | H01L 51/5256 313/506 |
| 2004/0262035 A1 | * | 12/2004 | Ko ......................... | H01L 24/17 174/260 |
| 2009/0090950 A1 | * | 4/2009 | Forbes ................... | H01L 24/13 257/301 |
| 2015/0115473 A1 | * | 4/2015 | Song ..................... | H01L 24/29 257/777 |

\* cited by examiner

*Primary Examiner* — Syed Gheyas
(74) *Attorney, Agent, or Firm* — Marshall, Gerstein & Borun LLP

(57) ABSTRACT

A method for fabricating at least a portion of a complementary circuit, such as a complementary inverter circuit, includes fabricating a first sheet and a second sheet. Each of the sheets includes metal layers, a dielectric layer, and a semiconductor channel layer, configured so as to form a plurality of transistors of a respective polarity (i.e., P-type for one sheet, N-type for the other). The method also includes placing a layer of conductive material, such as anisotropic conducting glue (ACG) or anisotropic conducting foil (ACF), on the first sheet, and bonding at least a portion of the second sheet to the first sheet such that the conductive material is disposed between and in contact with the top-most metal layers of the first and second sheets. Separately fabricating the two sheets of different polarity may improve yields and/or decrease costs as compared to fabricating both polarities on a single substrate.

15 Claims, 14 Drawing Sheets

BONDING P-TYPE AND N-TYPE SHEETS TO FORM COMPLEMENTARY CIRCUITS

CROSS-REFERENCE TO RELATED APPLICATIONS

This application claims priority to and the benefit of the filing date of U.S. Provisional Patent Application Ser. No. 62/266,100 filed on Dec. 11, 2015, the entire disclosure of which is hereby expressly incorporated by reference herein for all uses and purposes.

FIELD OF THE DISCLOSURE

The present disclosure relates generally to semiconductor device fabrication, and more particularly, to bonding two separately fabricated sheets containing P-type and N-type materials, respectively, to form complementary circuits, thereby potentially improving yields, lowering costs, improving performance, and/or providing other benefits relative to other fabrication techniques known in the art.

BACKGROUND

As is well-known in the art, complementary metal oxide semiconductor (CMOS) technology can provide important advantages relative to P-type metal oxide semiconductor (PMOS) or N-type metal oxide semiconductor (NMOS) technologies. In particular, CMOS circuits typically draw much less steady-state current than PMOS-only or NMOS-only circuits, and therefore provide much greater power efficiency. An example of the superior power efficiency of CMOS circuits is illustrated in connection with FIGS. 1A through 1C, which depict conventional inverter circuits (also referred to as "NOT" logic gates). As seen in FIG. 1A, an NMOS inverter 10 includes a first NMOS transistor 12 and a second NMOS transistor 14. NMOS transistor 12 is configured as a "pull-up resistor" by shorting the gate to the drain, while NMOS transistor 14 functions as an active switching element. When the input voltage $v_i$ changes to a "high" state, NMOS transistor 14 turns on (i.e., has a conducting channel), and NMOS inverter 10 draws current through both NMOS transistors 12, 14. This provides a "low" state at the output voltage $v_O$, but dissipates power in the resistive element (NMOS transistor 12). The current and power dissipation subsist until the input voltage $v_i$ changes to a "low" state, which causes NMOS transistor 14 to turn off (i.e., have a non-conducting channel). Similarly in FIG. 1B, a PMOS inverter 20 includes a first PMOS transistor 22 and a second PMOS transistor 24. PMOS transistor 22 is configured as a "pull-down resistor" by shorting the gate to the source, while PMOS transistor 24 functions as an active switching element. When the input voltage $v_i$ changes to a "low" state, PMOS transistor 24 turns on, and PMOS inverter 20 draws current through both PMOS transistors 22, 24. This provides a "high" state at the output voltage $v_O$, but dissipates power in the resistive element (PMOS transistor 22). The current and power dissipation subsist until the input voltage $v_i$ changes to a "high" state, which causes PMOS transistor 24 to turn off. In both inverters 10, 20, therefore, a relatively large amount of power is dissipated even in a steady-state condition.

By combining NMOS and PMOS active switching elements, and removing passive elements, one can avoid the steady-state current drain, and relatively large power dissipation, associated with inverters 10, 20. As seen in FIG. 1C, a CMOS inverter 30 includes a PMOS transistor 32 and an NMOS transistor 34, both of which are configured as active switching elements. The gates of both transistors 32, 34 are electrically coupled together and accept the input voltage $v_7$, and the source of PMOS transistor 32 is electrically coupled to the drain of NMOS transistor 34. When the input voltage $v_i$ changes to a "low" state, PMOS transistor 32 is turned on, but NMOS transistor 34 is turned off. When the input voltage $v_i$ changes to a "high" state, NMOS transistor 34 is turned on, but PMOS transistor 34 is turned off. Thus, CMOS inverter 30 only completes a conduction path for current between the power supply and ground during a brief time when the input voltage $v_i$ is changing from high to low, or vice versa. The lack of steady-state current can dramatically decrease power dissipation, and improve reliability, relative to inverters 10, 20. Moreover, the two actively switching elements of CMOS inverter 30 provide a balanced configuration, which generally permits higher switching speeds as compared to inverters 10, 20. Conversely, for inverters 10, 20, the resistance of the passive component (i.e., NMOS transistor 12 in FIG. 1A and PMOS transistor 22 in FIG. 1B) can interact with circuit capacitance to cause switching delays. In particular, switching the input voltage $v_i$ from high to low causes slower switching in NMOS inverter 10, and switching the input voltage $v_i$ from low to high causes slower switching in PMOS inverter 20. In addition to the CMOS inverter 30 of FIG. 1C, CMOS technology can provide improvements of this sort for other circuit configurations, such as a logical "NAND" gate configuration.

Due to these benefits, CMOS technology is widely used in different types of digital electronic circuit applications. Moreover, similar complementary circuit topologies are used in connection with other, non-MOS transistor technologies. One transistor technology to which the benefits of complementary circuits can be applied is that of organic thin film transistors (OTFTs). OTFTs are thin film transistors (TFTs) that use an organic material (e.g., small-molecule or polymeric semiconductors) for the N-type or P-type channel. Recent progress has been made with regard to integrating both N-type and P-type OTFTs on a single substrate to form a complementary arrangement (C-OTFT), such as the arrangement of the CMOS inverter 30 in FIG. 1C, for example. To date, this has been performed by processing N-type OTFTs and P-type OTFTs sequentially on the single substrate, and forming the appropriate electrical connections.

Both additive methods (e.g., printing) and subtractive methods (e.g., photolithography) have been used to fabricate C-OTFT circuits. When using additive methods, the P-type or N-type material is typically deposited only where needed. This approach is used in the emerging field of printed electronics, for example. When using subtractive methods, the P-type or N-type material is deposited over a large area (e.g., over the entire substrate), and subsequently removed everywhere except for those locations where the material is desired. This approach is used in conventional semiconductor and display processing facilities, for example.

Unfortunately, the processing steps involved in these additive and subtractive methods can give rise to various problems that cause lower yields, increased production costs and/or degraded performance of the C-OTFT circuits. FIG. 2A shows a stack 40 that may be built and used, along with the appropriate electrical connections, to form a C-OTFT circuit. In FIG. 2A (and throughout the figures), "P-OSC" refers to P-type organic semiconductor material for the P-type transistor channel, and "N-OSC" refers to N-type organic semiconductor material for the N-type transistor channel. While low-cost, high-throughput additive methods such as printing can be used to build stack 40, the process is complicated by the fact that all layers generally need to be compatible with both P-type and N-type OTFTs. Among other possible drawbacks, this restriction may limit the choice of materials, require performance tradeoffs, and/or increase cost. Alternatively, N-type and P-type OTFT stacks may be processed one on top of the other on the single substrate. With either technique, however, the monolithic integration of the N-type and P-type OTFT stacks on a single substrate causes complexities that will generally lower yields, degrade performance, limit the choice of materials, and/or increase costs. As one example, monolithic integration creates a "weakest link" situation, where a low-yield process for fabricating P-type OTFTs will result in an low overall yield for C-OTFT circuits even if the process for fabricating N-type OTFTs is high-yield, and vice versa.

Problems also arise when fabricating stack 40 using subtractive methods. For example, photolithography typically degrades the performance of both the N-type and P-type OTFTs within the C-OTFT circuit. In particular, the semiconductor materials that are applied first (e.g., for the P-type OTFTs) are degraded by the subsequent wet processing steps used to apply and pattern the remaining semiconductor materials (e.g., for the N-type OTFTs). Further, the processing needed to apply and selectively remove the first semiconductor layer (e.g., either the P-OSC or the N-OSC) typically results in contamination of the channel of the second semiconductor layer of the other polarity. In an attempt to avoid these problems, some recent techniques have instead processed the materials for the N-type and P-type OTFTs on different layers supported by the single substrate. Two such techniques are illustrated in FIGS. 2B and 2C. As seen in FIG. 2B, a stack 50 can be fabricated in which the N-type and P-type OTFT stacks are built one over the other on the substrate, with a single metal layer serving as both the gate of the P-type OTFTs and the source and drain of the N-type OTFTs. Alternatively, as seen in FIG. 2C, a stack 60 can be fabricated in which the N-type and P-type OTFT stacks share a single dielectric layer, with the gate of the P-type OTFT on the bottom and the gate of the N-type OTFT on the top (or vice versa). As with the stack 40, however, the stacks 50, 60 require monolithic integration of P-type and N-type OTFTs on a single substrate. As noted above, the complexity of monolithic integration generally leads to lower yields, degraded performance, limited choice of materials, and/or increased costs.

Despite these challenges, C-OTFT technology holds great potential for various different applications. One emerging area in which C-OTFT technology is well-suited for use is that of flexible displays. More generally, complementary circuit topologies have several potential applications within electronic displays. For example, complementary circuits may be used to form display driver circuits (i.e., circuits that drive the pixel circuits of the display) that are integrated on the backplane of the display using the same transistor technology as the pixel circuits. A typical pixel circuit 80 is shown in FIG. 3. The pixel circuit 80 includes only a single TFT 82, which can be either N-type or P-type, as well as various capacitors. The pixel circuit 80 may be used with active-matrix liquid crystal displays (LCDs), electronic paper displays (EPDs), electrowetting displays, and other display technologies. Complementary circuit topologies may be used within the driver to form a shift register (for the gate direction), a multiplexer circuit (for the gate and/or source direction), or a complete source driver, for example. Complementary circuits may even be used as a part of the display controller, and/or other electronics required for a product. Because each of these applications uses digital complementary circuits (e.g., including logic gates such as the inverter 30 of FIG. 1C), a huge decrease in power consumption may be obtained relative to non-complementary circuits (e.g., by roughly a factor of 300), as well as improved circuit reliability.

Complementary circuits may also be used in memory displays. This is a relatively recent development in which each pixel is associated with its own memory to store a grey level state. Because each pixel remembers its grey level state, there is no need to drive the pixel until that pixel changes to a different grey level state. As a result, the gate and source lines do not need to be driven continuously, and power consumption may be greatly reduced.

In yet another application, complementary circuits may be used for certain organic light-emitting diode (OLED) displays. Whereas complex circuitry is typically required to maintain a constant current across different grey levels of an OLED display over its lifetime, a complementary arrangement can reduce that complexity, reduce power consumption, and decrease the number of required signal lines per pixel.

SUMMARY

According to some aspects of the disclosure, a method for fabricating at least a portion of a complementary circuit includes fabricating a first sheet comprising a first substrate, a first lower metal layer, a first upper metal layer, a first dielectric layer disposed between the first lower metal layer and the first upper metal layer, and a first semiconductor channel layer. The first lower metal layer, the first upper metal layer, the first dielectric layer and the first semiconductor channel layer are configured so as to form a first plurality of transistors. The first plurality of transistors is one of (i) a plurality of P-type transistors or (ii) a plurality of N-type transistors. The first lower metal layer forms a drain and a source for each of the first plurality of transistors and the first upper metal layer forms a gate for each of the first plurality of transistors (e.g., for a "top gate" configuration) or, alternatively, the first lower metal layer forms a gate for each of the first plurality of transistors and the first upper metal layer forms a drain and a source for each of the first plurality of transistors (e.g., for a "bottom gate" configuration). The method also includes fabricating a second sheet comprising a second substrate, a second lower metal layer, a second upper metal layer, a second dielectric layer, and a second semiconductor channel layer. The second lower metal layer, the second upper metal layer, the second dielectric layer and the second semiconductor channel layer are configured so as to form a second plurality of transistors. The second plurality of transistors is the other one of (i) the plurality of P-type transistors or (ii) the plurality of N-type transistors. The second lower metal layer forms a drain and a source for each of the second plurality of transistors and the second upper metal layer forms a gate for each of the second plurality of transistors or, alternatively, the second lower metal layer forms a gate for each of the second plurality of transistors and the second upper metal layer forms a drain and a source for each of the second plurality of transistors. The method also includes placing a layer of conductive material on the first sheet, and bonding at least a portion of the second sheet to the first sheet such that the layer of conductive material is disposed between and in contact with a first top metal layer and a second top metal layer, and such that the layer of conductive material provides electrically conducting paths between (i) areas of metal on the first top metal layer and (ii) areas of metal on the second top metal layer that are vertically aligned with the areas of metal on the first top metal layer. The first top metal layer is either (i) the first upper metal layer or (ii) a different layer of the first sheet that is electrically coupled to one or more areas of at least the first upper metal layer and is separated from the first upper metal layer at least by a first set of one or more additional dielectric layers. The second top metal layer is either (i) the second upper metal layer or (ii) a different layer of the second sheet that is electrically coupled to one or more areas of at least the second upper metal layer and is separated from the second upper metal layer at least by a second set of one or more additional dielectric layers.

According to other aspects of the disclosure, an article includes a first sheet comprising a first substrate, a first lower metal layer, a first upper metal layer, a first dielectric layer, and a P-type semiconductor channel layer. The first lower metal layer, the first upper metal layer, the first dielectric layer and the P-type semiconductor channel layer are configured so as to form a plurality of P-type transistors. The first lower metal layer forms a drain and a source for each of the plurality of P-type transistors and the first upper metal layer forms a gate for each of the plurality of P-type transistors (e.g., for a "top gate" configuration) or, alternatively, the first lower metal layer forms a gate for each of the plurality of P-type transistors and the first upper metal layer forms a drain and a source for each of the plurality of P-type transistors (e.g., for a "bottom gate" configuration). The article also includes a second sheet comprising a second substrate, a second lower metal layer, a second upper metal layer, a second dielectric layer, and an N-type semiconductor channel layer. The second lower metal layer, the second upper metal layer, the second dielectric layer and the N-type semiconductor channel layer are configured so as to form a plurality of N-type transistors. The second lower metal layer forms a drain and a source for each of the plurality of N-type transistors and the second upper metal layer forms a gate for each of the plurality of N-type transistors or, alternatively, the second lower metal layer forms a gate for each of the plurality of N-type transistors and the second upper metal layer forms a drain and a source for each of the plurality of N-type transistors. The article also includes a layer of a conductive material disposed between and in contact with a first top metal layer and a second top metal layer. The first top metal layer is either (i) the first upper metal layer or (ii) a different layer of the first sheet that is electrically coupled to one or more areas of at least the first upper metal layer and is separated from the first upper metal layer at least by a first set of one or more additional dielectric layers. The second top metal layer is either (i) the second upper metal layer or (ii) a different layer of the second sheet that is electrically coupled to one or more areas of at least the second upper metal layer and is separated from the second upper metal layer at least by a second set of one or more additional dielectric layers. The layer of conductive material provides electrically conducting paths between (i) areas of metal on the first top metal layer and (ii) areas of metal on the second top metal layer that are vertically aligned with the areas of metal on the first top metal layer.

In some arrangements, the layer of conductive material does not provide electrically conducting paths between (i) the areas of metal on the first top metal layer and (ii) any areas of metal on the second top metal layer that are not vertically aligned with the areas of metal on the first top metal layer. The layer of conductive material may be a layer of an anisotropic conducting material such as anisotropic conducting glue (ACG) or anisotropic conducting foil (ACF), for example.

In some arrangements, the layer of conductive material includes a conductive adhesive material embedded in a non-conductive adhesive material. In other arrangements, the layer of conductive material includes a conductive non-adhesive material embedded in a non-conductive adhesive material.

In some arrangements, the first plurality of transistors and the second polarity of transistors collectively include a plurality of opposite-polarity transistor pairs, and bonding at least the portion of the second sheet to the first sheet comprises aligning at least the portion of the second sheet to the first sheet such that, after bonding, and for each of the plurality of opposite-polarity transistor pairs, the layer of conductive material electrically couples one or more of the gate, the drain and the source of one of the first plurality of transistors to one or more of the gate, the drain and the source, respectively, of a corresponding one of the second plurality of transistors. For example, the two sheets may be fabricated such that the sheets form a number of inverters in a complementary circuit topology when bonded together via the layer of conductive material, with the gate and the drain of one transistor in each opposite-polarity transistor pair being electrically coupled to the gate and the drain, respectively, of the corresponding transistor of the opposite polarity. Inverter circuits, and other circuit topologies, may also necessitate fabricating a number of metal vias. For example, fabricating the first sheet may include forming a first plurality of metal vias, with each of the first plurality of metal vias either (i) if the first lower metal layer forms the drains and the sources for the first plurality of transistors, electrically coupling the drain and/or the source for a respective one of the first plurality of transistors to one or two respective bonding pads on the first upper metal layer, or (ii) if the first lower metal layer forms the gates for the first plurality of transistors, electrically coupling the gate for a respective one of the first plurality of transistors to a respective bonding pad on the first upper metal layer. Similarly, fabricating the second sheet may include forming a second plurality of metal vias, with each of the second plurality of metal vias either (i) if the second lower metal layer forms the drains and the sources for the second plurality of transistors, electrically coupling the drain and/or the source for a respective one of the second plurality of transistors to one or two respective bonding pads on the second upper metal layer, or (ii) if the second lower metal layer forms the gates for the second plurality of transistors, electrically coupling the gate for a respective one of the second plurality of transistors to a respective bonding pad on the second upper metal layer.

In some arrangements, the substrate of the first sheet or the substrate of the second sheet is a touch sensor substrate, or acts as an environmental barrier. In other arrangements, each sheet is fabricated with a respective environmental barrier, and the two environmental barriers seal substantially an entirety of the first sheet and the second sheet when the sheets are bonded together.

In some arrangements, the first sheet is tested to detect defects after fabricating the first sheet, but prior to bonding at least the portion of the second sheet to the first sheet, and the second sheet is tested to detect defects after fabricating the second sheet, but prior to bonding at least the portion of the second sheet to the first sheet.

In some arrangements, after the second sheet is fabricated, at least a portion of the second sheet is cut into a plurality of strips each containing at least some of the transistors on the second sheet, and at least one of the plurality of strips is bonded to the first sheet. In other arrangements, the second sheet itself is a strip of a larger sheet, or is otherwise smaller than the first sheet. For example, the second sheet may be less than half the size of the first sheet, or vice versa. In some arrangements where the second sheet is cut into a plurality of strips, at least one of the plurality of strips is tested, prior to bonding the at least one strip to the first sheet, to detect defects.

In some arrangements, the transistors of the first and second sheets are organic thin film transistors (OTFTs). In other arrangements, the transistors of one or both sheets are inorganic thin film transistors (TFTs). For example, the transistors of the first sheet may be P-type OTFTs, and the transistors of the second sheet may be amorphous Silicon (a-Si) transistors. In still other arrangements, the transistors of one or both sheets are not TFTs.

In some arrangements, the first sheet is bonded to the second sheet in part by aligning a first alignment marker on the first sheet with a second alignment marker on the second sheet.

In some arrangements, fabricating the first sheet includes forming, in the first top metal layer, a first plurality of bonding pads, and fabricating the second sheet includes forming, in the second top metal layer, a second plurality of bonding pads, each to be electrically coupled to a corresponding one of the first plurality of bonding pads via the layer of conductive material, and each being positioned such that the bonding pad is at an angular offset relative to the corresponding one of the first plurality of metal pads when the second sheet is bonded to the first sheet.

In some arrangements, fabricating the first sheet and fabricating the second sheet are performed independently of each other, with each using an additive processing method such as gravure printing, a subtractive processing method such as photolithography, or some combination thereof. The two sheets may be fabricated using the same technique, or using different techniques.

In some arrangements, the first sheet further includes an active display matrix containing an additional plurality of transistors, and the additional plurality of transistors form a plurality of pixel circuits within the active display matrix.

In some arrangements, the plurality of transistors in the first sheet and the plurality of transistors in the second sheet form complementary display driver circuitry.

In some arrangements, a flexible display apparatus includes the first sheet and the second sheet, as bonded together by the layer of conductive material.

Additional aspects, arrangements, and features in accordance with the present disclosure will be evident upon study of the drawings and the following descriptions thereof.

DETAILED DESCRIPTION OF THE DRAWINGS

Figures 1A, 1B, 1C:
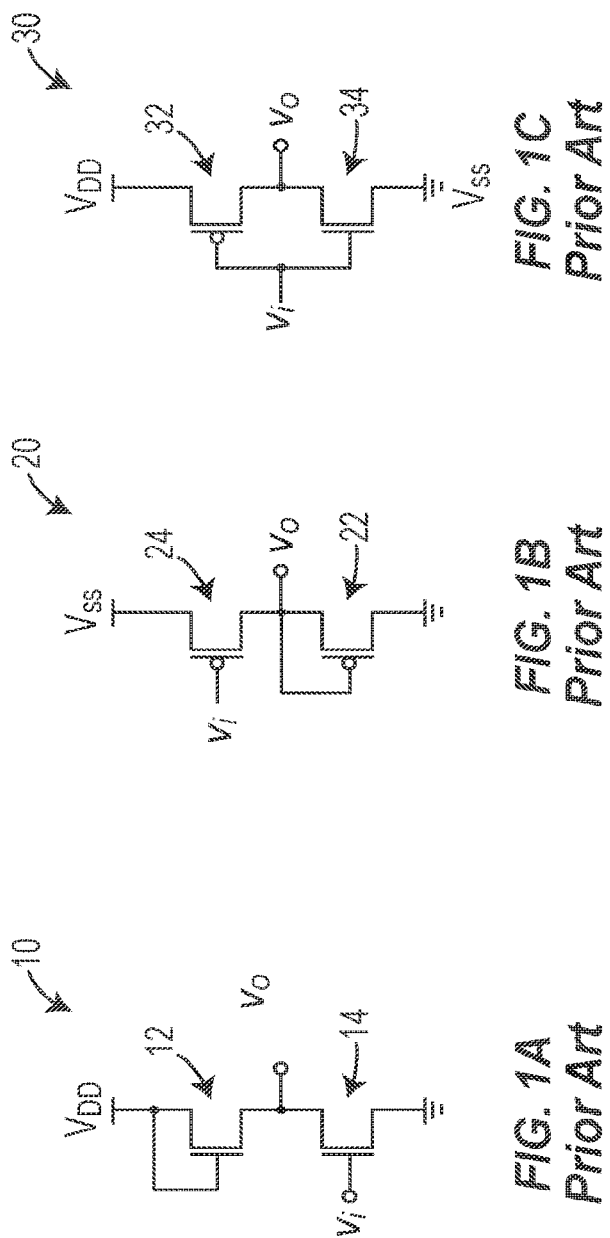
FIGS. 1A-1C depict common inverter circuits utilizing transistors in a complementary arrangement.
Figure 2A:
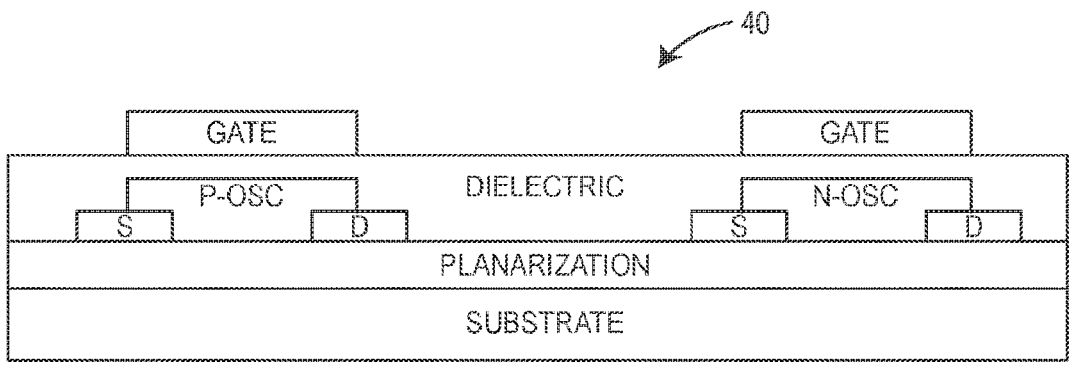
FIG. 2A is an enlarged, cross-sectional view of a conventional stack incorporating both P-OSC and N-OSC materials.
Figure 2B:
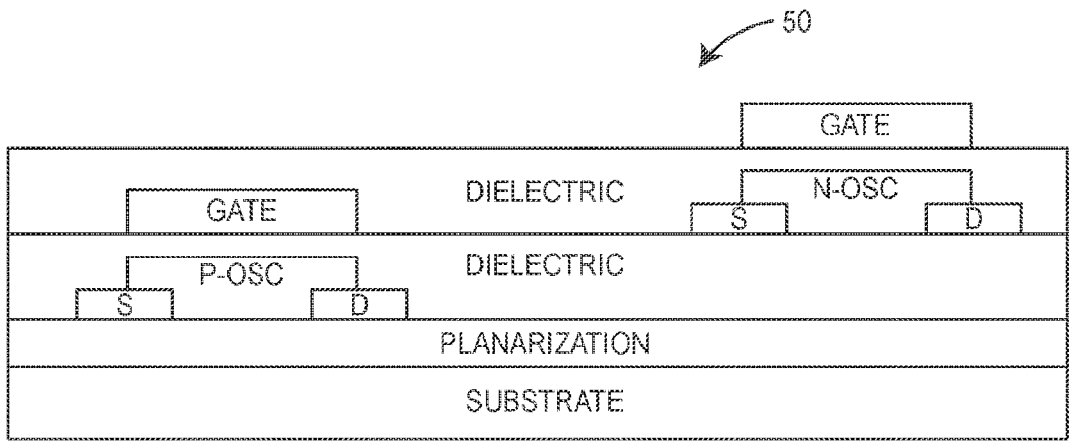
FIGS. 2B and 2C are enlarged, cross-sectional views of alternative stacks that have previously been developed in an effort to overcome problems associated with the stack of FIG. 2A.
Figure 2C:
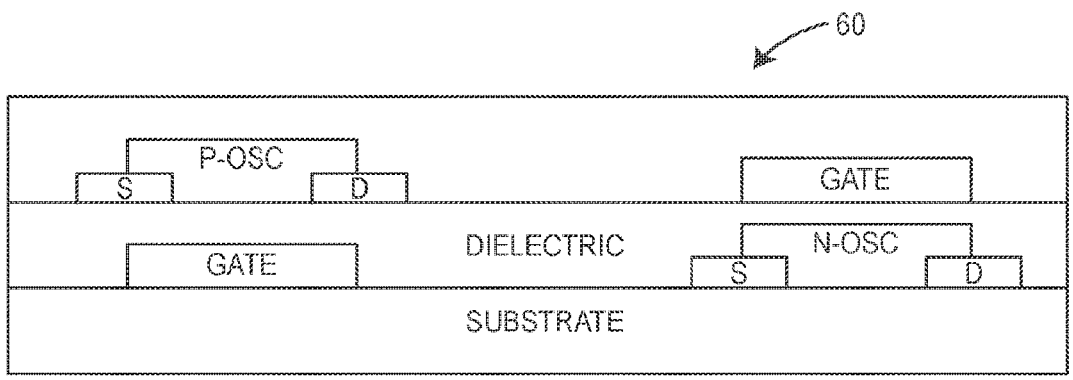

Generally, according to some aspects of the disclosure, complementary electronic circuits are formed by bonding two separately fabricated sheets containing P-type semiconductor transistors and N-type semiconductor transistors. Each of the P-type and N-type sheets (more generally referred to herein as "polarity sheets") may be independently fabricated on a separate substrate before the bonding process begins. To improve overall yields, the two polarity sheets may also be individually tested before bonding. Thus, for instance, the P-type sheet may be preserved even if the N-type sheet fails testing, and vice versa.

In some aspects, the P-type sheet and the N-type sheet may have a structurally similar appearance when viewed as a cross-section. If both sheets have a "top gate, bottom contact" configuration (as explained further below), for example, each sheet may include a substrate, a planarization layer on the substrate, a non-continuous (patterned) lower metal layer with transistor sources and drains on the planarization layer, a non-continuous semiconductor channel layer (P-type or N-type, depending on sheet polarity) on the lower metal layer, a dielectric layer on the semiconductor channel layer, and a non-continuous upper metal layer with transistor gates on the dielectric layer. The upper metal layer and/or the lower metal layer, on one or both of the polarity sheets, may also include traces as needed to form the desired circuits, and the dielectric layer may include metal vias where needed to form the desired circuits. The upper metal layer may expose a number of metal bonding pads for forming electrical connections with bonding pads on the upper metal layer of the opposite polarity sheet (i.e., when the two sheets are bonded as discussed below). Alternatively, one or both of the polarity sheets may be fabricated such that the sheet has one or more additional dielectric layers and one or more additional metal layers on top of the upper metal layer, with the outermost/top layer being a metal layer that exposes bonding pads for the desired electrical connections with the opposite polarity sheet. The additional dielectric and metal layers may be advantageous for circuits that require complex routing, for example, by reducing or eliminating the need to route connections on the same metal layers that include the transistor gates, sources and drains.

To bond the two polarity sheets together, a continuous or non-continuous layer of conductive material may be applied to one of the sheets. The conductive material may be a material having anisotropic conductive properties. In particular, the conductive material may have very little or no lateral conductance (i.e., little or no conductance in any direction parallel to the planes of the two polarity sheets), and may only form conductive paths in a vertical direction (i.e., in a direction orthogonal to the planes of the two polarity sheets) in those areas where metal is present and vertically aligned on both of the two top metal layers. The conductive material may be anisotropic conductive glue (ACG) or anisotropic conductive foil (ACF), for example. After the conductive material is applied, the two polarity sheets are brought together, and the appropriate pressure is applied (possibly with heat or ultraviolet light) for an appropriate length of time to form a single, combined sheet from the two polarity sheets.

For the bonding process, the two polarity sheets are generally aligned so as to form electrical connections between the sheets at the desired locations, while avoiding undesired electrical connections (shorts). To form a complementary inverter circuit topology as shown in FIG. 1C, for example, each sheet may include one or more metal vias and/or traces connecting a drain on the lower metal layer (if in a "top gate" configuration) to an output bonding pad on the top metal layer, and the gate and output bonding pad of a P-type transistor on the P-type sheet may be electrically coupled directly to the gate and output bonding pad, respectively, of an N-type transistor on the N-type sheet.

To achieve proper alignment, the two polarity sheets may be aligned using one or more registration/alignment markers. Other techniques may also be used to ensure that the appropriate electrical connections are made, such as increasing metal contact/pad sizes as distance from the alignment marker(s) increases, and/or offsetting angles of metal contacts/pads relative to one another (e.g., setting a rectangular pad on the P-type sheet at a 90 degree or other angle relative to a corresponding rectangular pad on the N-type sheet). For applications where transistors of one polarity are not needed within relatively large areas, materials and cost may be reduced by dividing/cutting the corresponding polarity sheet into smaller pieces, and bonding those smaller pieces to the opposite polarity sheet only in select areas.

The techniques described above and elsewhere herein may provide various advantages. For example, overall yields may be optimized or otherwise improved (e.g., by avoiding the need to discard the N-type sheet when a P-type sheet is defective, or vice versa), and/or circuit performance may be improved (e.g., by lessening contamination caused by subsequent processing steps on a single substrate). Moreover, for some applications where large areas of circuitry require transistors of only one polarity (e.g., for certain electronic display applications), the techniques described herein may, in some aspects, further improve yields and reduce costs by vitiating the need for correspondingly large areas of material of the opposite polarity. Further, for some applications where a particular type of substrate is already required (e.g., an environmental barrier, touch screen, etc.), the techniques described herein may, in some aspects, permit greater efficiencies by building one of the polarity sheets on that substrate. These and other potential advantages will become apparent from the figures and description that follows.

Certain advantages may result when using aspects of the present disclosure with organic thin film transistors (OTFTs) to form complementary OTFT (C-OTFT) circuits. Thus, different aspects or implementations of the invention are described below with reference to OTFTs and C-OTFT circuits. It is understood, however, that the present invention may generally be used with other transistor technologies, such as CMOS or inorganic TFTs.

Figure 4:
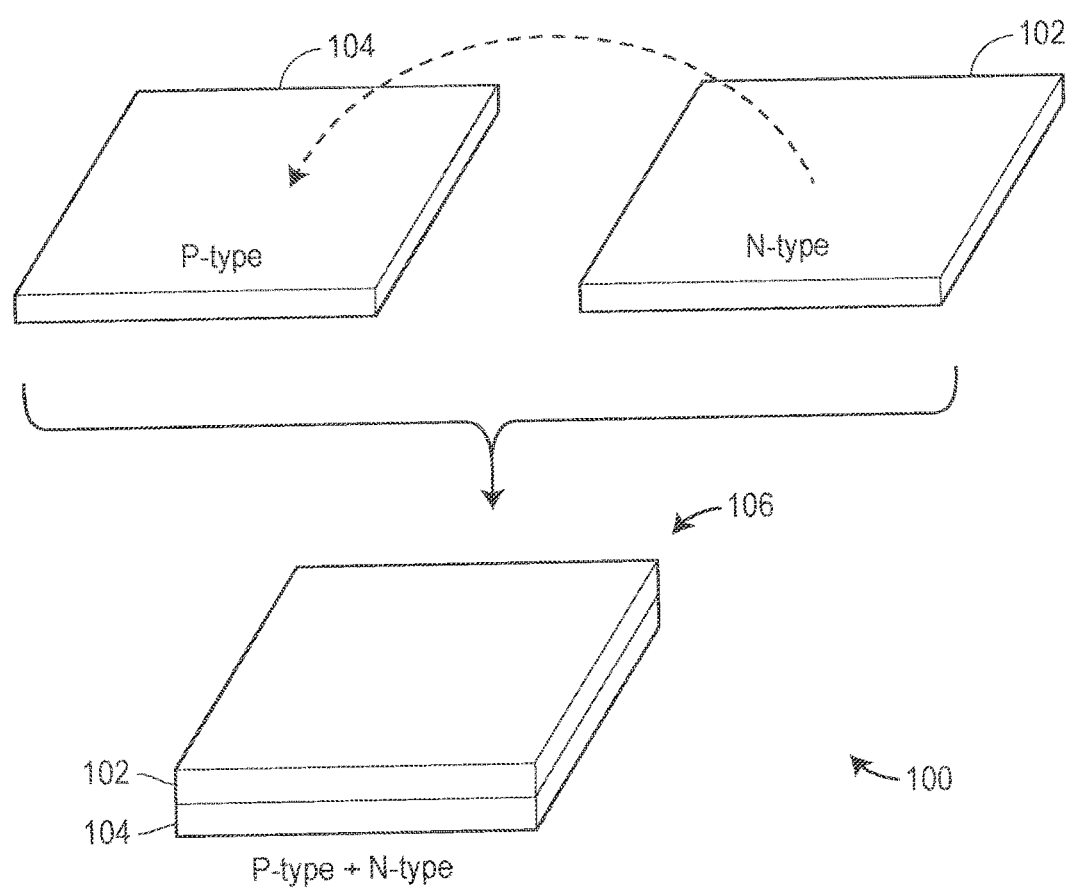
FIG. 4 depicts an example process for forming complementary circuitry, according to one aspect of the present disclosure.

Turning first to FIG. 4, an example process 100 is shown at a high level of generality. In the process 100, an N-type sheet 102 is bonded to a P-type sheet 104 to form a combined sheet 106 (e.g., a "wafer"). Prior to the bonding process, each of the two polarity sheets 102, 104 is formed on a different, respective substrate having desired mechanical properties (e.g., a particular degree of flexibility). Moreover, each of the polarity sheets 102, 104 includes metal and dielectric layers, in combination with the appropriate N-type or P-type semiconductor materials, to form a number of N-type or P-type OTFTs, respectively. Preferably, the N-type materials in polarity sheet 102 are matched to the P-type materials in polarity sheet 104, such that certain characteristics of the two materials are similar. One or both of the polarity sheets 102, 104 may also include additional metal traces to form circuit connections as desired. Preferably, the sheets 102, 104 are bonded together using an anisotropic conducting material, such as ACG or ACF. The polarity sheets 102, 104 and anisotropic conducting materials are described below in more detail (e.g., in connection with FIGS. 5A and 6), according to various aspects of the invention.

In one aspect of the invention, each of the polarity sheets 102, 104 includes an environmental barrier that covers the outer face of the sheet (i.e., the face that is not brought into contact with the other of polarity sheets 102, 104). Alternatively, the environmental barrier is applied as a different layer, such as the first layer of the inner face of the sheet, or a second layer after a planarization or buffer layer. The environmental barrier may comprise or consist of silicon nitride (SiNx), aluminum oxide (AlOx), aluminum oxinitride (AlOxNx), or any other suitable material. When the two polarity sheets 102, 104 come into contact, the two environmental barriers may also come into contact, or nearly into contact (e.g., separated only by adhesive and/or other thin layers), thereby sealing substantially the entire combined sheet 106 (e.g., everywhere except for small areas in which metal traces for coupling to power sources and/or other circuits need to be exposed).

Figure 5A:
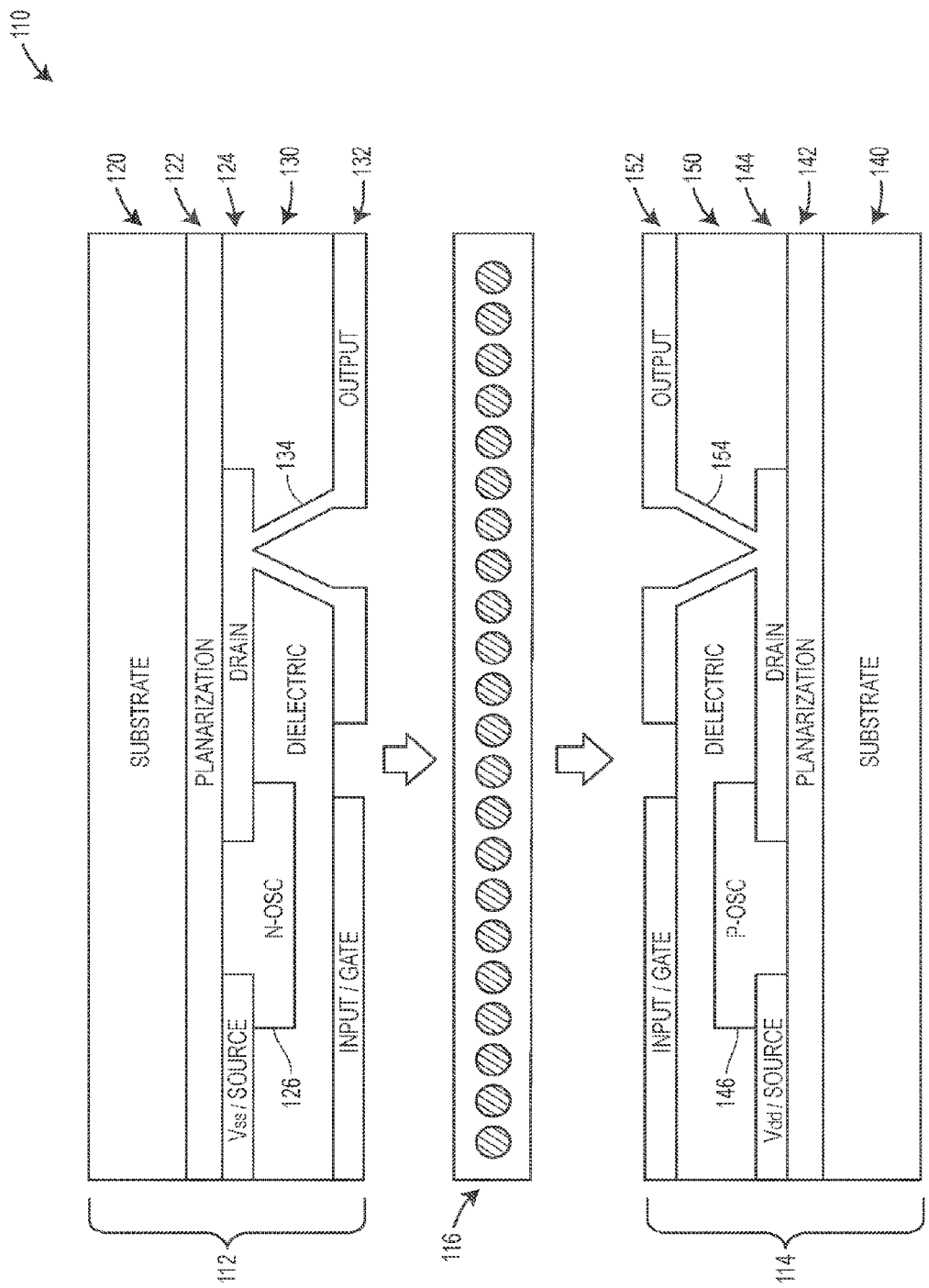
FIG. 5A depicts an enlarged, cross-sectional view of two polarity sheets, each having a "top gate, bottom contact" configuration, in an example process for forming complementary circuitry, such as the process of FIG. 4, according to one possible arrangement.

FIG. 5A depicts an enlarged, cross-sectional view corresponding to an example process 110. The process 110 may be a more detailed view of the process 100 of FIG. 4, according to one implementation. In the process 110, an N-type sheet 112 (e.g., sheet 102 of FIG. 4) is bonded to a P-type sheet 114 (e.g., sheet 104 of FIG. 4) using an anisotropic conducting material 116. In this example, each of the sheets 112, 114 has a "top gate, bottom contact" configuration. "Top gate" refers to a configuration in which the gate is on the upper metal layer (i.e., above the dielectric layer) and the drain and source are on the lower metal layer (i.e., below the dielectric layer), while "bottom gate" refers to the reverse configuration. Moreover, "bottom contact" refers to a configuration in which the semiconductor channel layer is deposited after the metal layer containing the drain and source, while "top contact" refers to the reverse order of deposition. It is understood that, for purposes of clarity, FIG. 5A depicts what may be only a small portion of the entire N-type sheet 112 and only a small portion of the entire P-type sheet 114. Thus, while FIG. 5A shows materials for only one transistor in each of the polarity sheets 112, 114, one or both of the polarity sheets 112, 114 may instead have more than one transistor (e.g., tens, hundreds, or thousands of transistors each). Moreover, as used herein, terms that refer to placement in a vertical direction (e.g., "top," "bottom," "lower," "upper," etc.) should be understood relative to an arrangement in which the polarity sheet face that will come into direct contact with the other polarity sheet (upon bonding) is considered the upper/top-most face of that polarity sheet.

As seen in FIG. 5A, the N-type sheet 112 includes a substrate 120, a planarization layer 122 adjacent to the substrate 120, and a lower metal layer 124 adjacent to the planarization layer 162. The lower metal layer 124 is generally not continuous, but instead is arranged to form source and drain contacts for each N-type OTFT within the N-type sheet 112. N-type organic semiconductor channel layer 126 includes semiconductor material that is disposed between, and partially on top of, the sources and drains of the lower metal layer 124 to form the N-type OTFTs. A dielectric layer 130 is disposed on the lower metal layer 124 and semiconductor channel layer 126. Because the lower metal layer 124 and semiconductor channel layer 126 do not cover the entire cross-section of the N-type sheet 112, a portion of the dielectric layer 130 is in contact with the planarization layer 122. An upper metal layer 132 is adjacent the dielectric layer 130 and, before the sheets 112, 114 are bonded together, may or may not remain exposed depending on whether additional dielectric and metal layers are added. Like the lower metal layer 122, the upper metal layer 132 is generally not continuous. Rather, the upper metal layer 132 is arranged to form gate/input and output contacts for each N-type OTFT within the N-type sheet 112. A metal via 134 electrically couples each output of the upper metal layer 132 to each respective drain of the lower metal layer 124.

Similar to the N-type sheet 112, the P-type sheet 114 includes a substrate 140, a planarization layer 142 adjacent to the substrate 140, and an lower metal layer 144 adjacent to the planarization layer 142. The lower metal layer 144 is generally not continuous, but instead is arranged to form source and drain contacts for each P-type OTFT within the P-type sheet 114. P-type organic semiconductor channel layer 146 includes semiconductor material that is disposed between, and partially on top of, the sources and drains of the lower metal layer 144 to form the P-type OTFTs. A dielectric layer 150 is disposed on the lower metal layer 144 and semiconductor channel layer 146. Because the lower metal layer 144 and semiconductor channel layer 146 do not cover the entire cross-section of the P-type sheet 114, a portion of the dielectric layer 150 is in contact with the planarization layer 142. An upper metal layer 152 is adjacent the dielectric layer 150 and, before the sheets 112, 114 are bonded together, may or may not remain exposed depending on whether additional dielectric and metal layers are added.

Like the lower metal layer 142, the upper metal layer 152 is generally not continuous. Rather, the upper metal layer 152 is arranged to form gate/input and output contacts for each P-type OTFT within the P-type sheet 114. A metal via 154 electrically couples each output of the upper metal layer 152 to each respective drain of the lower metal layer 144.

The metal layers of the polarity sheets 112, 114 (including metal layers 124, 132, 144 and/or 152) may use any suitable metal material, such as molybdenum, aluminum, silver, gold or combinations thereof, for example. The substrates 120 and/or 140 may be formed of plastic materials such as polyester (PET), polyethylene napthalate (PEN), polyimide (PI), polycarbonate (PC) or polyether ether ketone (PEEK), for example. The thickness may be from 6 to 250 microns, or within a different suitable range. Alternatively, the substrates 120 and/or 140 may be formed of other, non-plastic materials, such as metal (e.g., steel) or thin glass (e.g., 50-200 microns thick). The planarization layers 122 and/or 142 may be formed of a common photoresist such as SC100 or SU8, for example. Alternatively, other materials such as cross-linkable polymer layers may be used (e.g., by applying the planarization layer using spin coating, slit coating or spray coating). The dielectric layers 130 and/or 150 may be formed of materials such as silicon nitride or silicon oxide, for example. If OTFT organic dielectric materials are needed, materials such as SU8, poly(vinyl phenol) (PVP) or proprietary cross-linkable polymers may be used, for example.

Figure 5B:
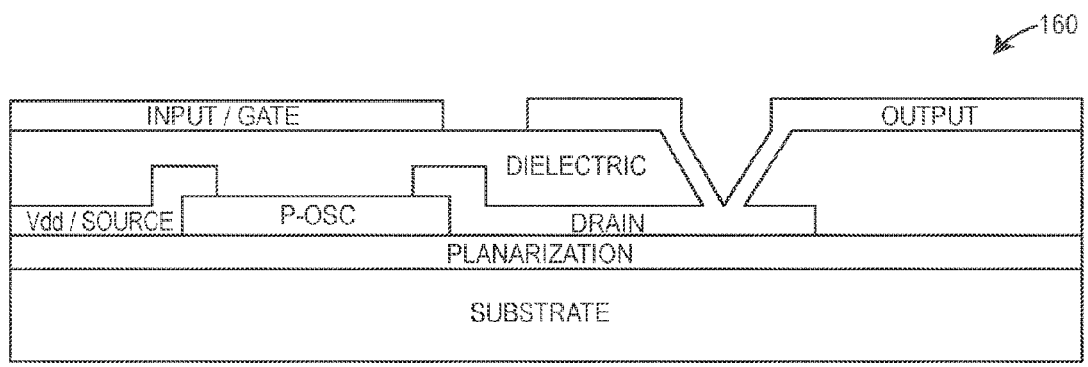
FIG. 5B depicts an enlarged, cross-sectional view of another P-type sheet, having a "top gate, top contact" configuration, that may instead be used in the process of FIG. 5A, according to one possible arrangement.
Figure 5C:
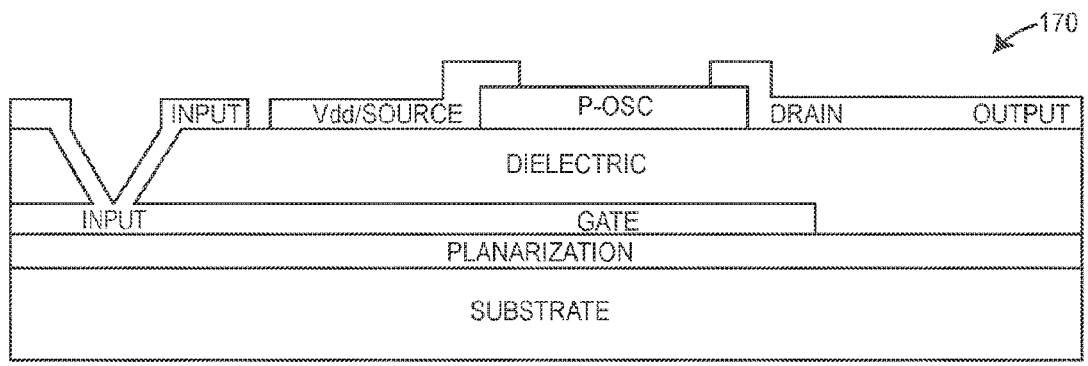
FIG. 5C depicts an enlarged, cross-sectional view of another P-type sheet, having a "bottom gate, top contact" configuration, that may instead be used in the process of FIG. 5A, according to one possible arrangement.
Figure 5D:
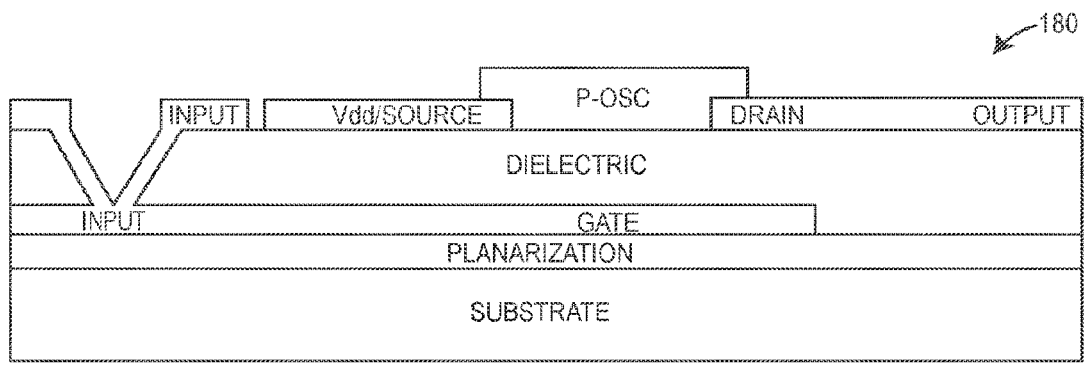
FIG. 5D depicts an enlarged, cross-sectional view of another P-type sheet, having a "bottom gate, bottom contact" configuration, that may instead be used in the process of FIG. 5A, according to one possible arrangement.

In other implementations, one or both of the polarity sheets 112, 114 may include more, fewer or different layers than those shown in FIG. 5A, and/or some of the layers may be arranged in a different order. For example, the sheet 112 may include one or more additional dielectric layers and metal layers (e.g., in an alternating fashion) on top of upper metal layer 132, and/or the sheet 114 may include one or more additional dielectric layers and metal layer on top of upper metal layer 152. As another example, one or both of the polarity sheets 112, 114 may have a configuration different than the "top gate, bottom contact" configuration shown in FIG. 5A. For example, the P-type sheet 114 may have a "top gate, top contact" configuration (as seen in sheet 160 of FIG. 5B), a "bottom gate, top contact" configuration (as seen in sheet 170 of FIG. 5C), or a "bottom gate, bottom contact" configuration (as seen in sheet 180 of FIG. 5D). The N-type sheet 112 may have the same configuration as the P-type sheet 114, or a different configuration. For example, the N-type sheet 112 may have the configuration shown in FIG. 5A, and the P-type sheet 114 may have the configuration shown in FIG. 5B. To most efficiently form a particular circuit topology, some of the configurations shown in FIGS. 5A-5D may require additional dielectric and/or metal layers on top of the layers shown. For example, the "bottom gate" configurations of FIGS. 5C and 5D may, in some implementations, preferably have at least one additional dielectric/metal layer pair on top of the metal layer containing the drain and source (for sheet 170 of FIG. 5C) or on top of the semiconductor channel layer (for sheet 180 of FIG. 5D).

As is apparent from FIGS. 5A-5D and the above description, a "layer" does not necessarily correspond strictly to a particular range (in the vertical direction). In FIG. 5A, for instance, the dielectric layer 130 in the N-type sheet 112 occupies some of the same vertical range as the lower metal layer 124, and the dielectric layer 150 in the P-type sheet 114 occupies some of the same vertical range as the lower metal layer 144. Generally, a "layer" may refer to both (1) a particular material, and (2) the order, within the fabrication process for each individual sheet, in which the material is deposited (e.g., when using printing methods) or subtracted (e.g., when using photolithography) relative to other materials/layers.

Referring again to FIG. 5A and the process 110, the anisotropic conducting material 116 is first placed on the P-type sheet 114. The N-type sheet 112 is then precisely aligned with the P-type sheet 114, and brought into contact with the P-type sheet 114 such that the anisotropic conducting material 116 is sandwiched between the sheets 112, 114 (in the manner shown in FIG. 5A) using the appropriate amount of pressure, and the appropriate amount of heat and/or ultraviolet light, for the appropriate amount of time. Alternatively, the anisotropic conducting material 116 may first be placed on the N-type sheet 112, and the P-type sheet 114 may then be aligned and brought into contact with the N-type sheet 112. The anisotropic conducting material 116 may be applied uniformly such that the anisotropic conducting material 116 covers the entire polarity sheet 112 (and/or the entire polarity sheet 114), or may be applied only in select, limited areas. In some implementations, for example, the anisotropic conducting material 116 is generally not applied in areas where no electrical connections are needed between the upper metal layers 132 and 152 (or other top metal layers, if additional dielectric/metal layers are used) of polarity sheets 112 and 114, respectively.

In some implementations, a patterned sheet of adhesive, with patches of anisotropic conducting material at the appropriate positions, is used to create a strong bond between the sheets 112, 114 with electrical conductance at the appropriate places. Alternatively, a regular (i.e., non-anisotropic) conducting adhesive may be used within the patterned sheet, so long as the position(s) of the adhesive may be controlled tightly enough to avoid undesired lateral electrical connections between bonding pads on the sheets 112, 114. In still other implementations, the conductive material within the patterned adhesive sheet is not itself an adhesive material, and the bond may maintained solely by the patterned adhesive sheet.

Figure 6:
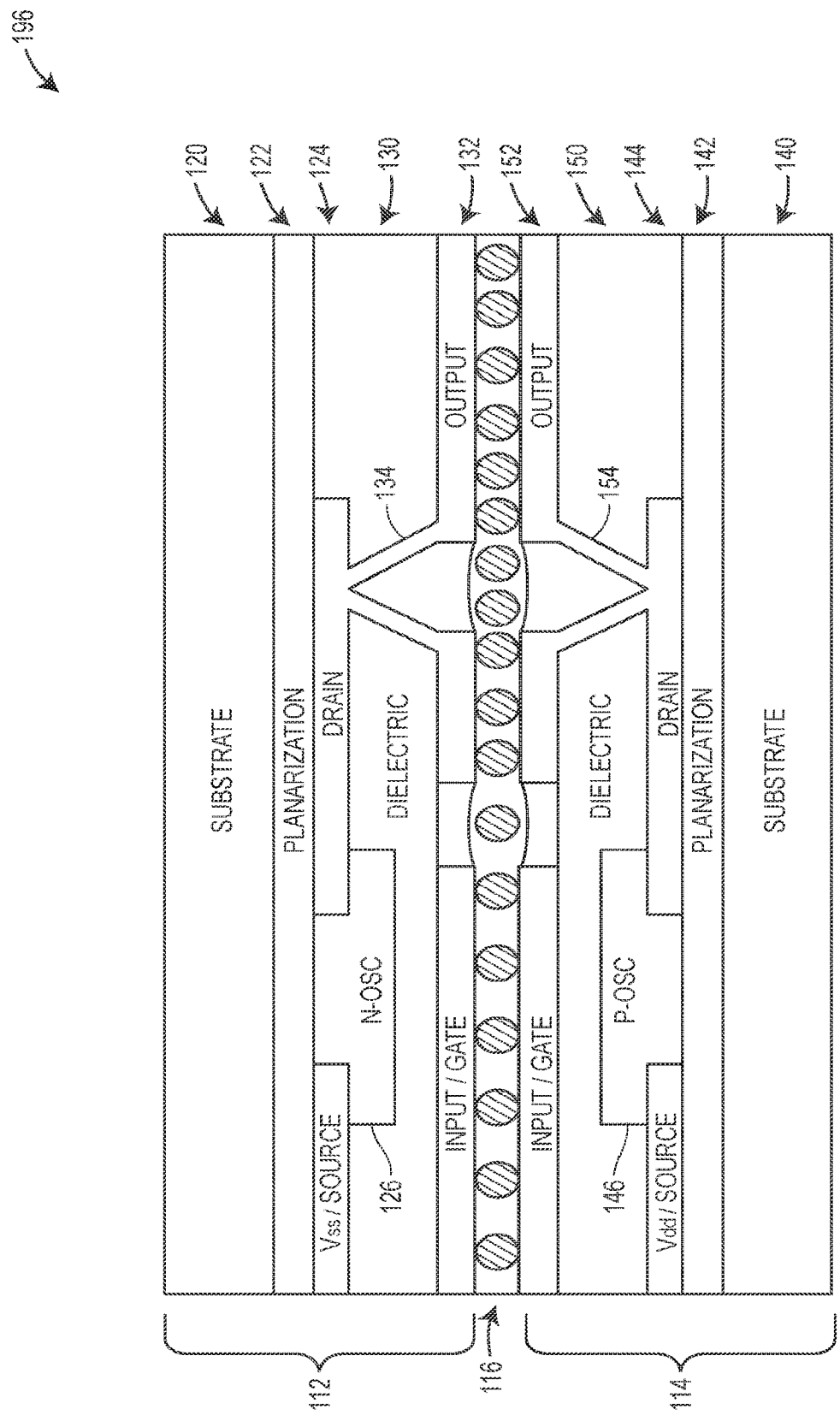
FIG. 6 depicts an enlarged, cross-sectional view of the two polarity sheets of FIG. 5A after the process of FIG. 5A has been completed, according to one possible arrangement.

Preferably, the anisotropic conducting material 116 is ACG or ACF. As is known in the art, ACG and ACF typically contain small metal particles (e.g., gold spheres) embedded in a pressure-sensitive and/or ultraviolet-sensitive adhesive. These small metal particles are depicted as shaded circles in the anisotropic conducting material 116 of FIG. 5A. Purely for purposes of clarity, the metal particles are depicted in FIG. 5A as being relatively large, and uniform in size and spacing. While applying the appropriate temperature/heat and/or light, and applying the appropriate pressure to the two sheets 112, 114, the adhesive of the anisotropic conducting material 116 is compressed such that the conductive metal particles simultaneously touch the materials on both sides of the anisotropic conducting material 116. The principle of operation for ACG and ACF is illustrated in FIG. 6, which depicts a composite sheet 196 after the process 110 has been completed. As seen in FIG. 6, the metal particles form a conductive path in the vertical direction only in those areas where the anisotropic conducting material 116 is directly contacted by metal on both the upper metal layer 132 and the upper metal layer 152. The low density of the metal particles prevents lateral conductance, thereby preventing undesired shorts.

The cross-sectional views of FIGS. 5A and 6 depict two transistors (one N-type, one P-type) that, when the polarity sheets 112, 114 are bonded as shown in FIG. 6, form a single complementary inverter circuit. In particular, when the power source, ground, input and output are connected at the appropriate points, the combined sheet 196 forms a circuit having the topology of the inverter 30 shown in FIG. 1C. In other implementations, however, or in other portions of the polarity sheets 112, 114 that carry other transistors, the N-type and P-type transistors may be arranged in a different manner relative to each other. For example, the N-type and P-type transistors of the N-type sheet 112 and the P-type sheet 114, respectively, may be arranged so as to form one or more complementary "NAND" gates. To form the desired circuits, any one or more of the metal layers 124, 132, 144, 152, and/or one or more additional metal layers not shown in FIG. 5A or 6, may contain conductive (e.g., metal) traces that form electrical connections as needed to form the desired circuits. Preferably, most of the conductive traces are formed on the lower metal layer(s) 164 and/or 184, and/or on any additional metal layer(s) not shown in FIG. 5A or 6, in order to prevent undesired electrical coupling between traces on the upper metal layers 172, 182 that would intersect in the vertical direction (thereby causing the anisotropic conducting material 156 to short the traces). Additional vias may also be included, between lower metal layer 164 and upper metal layer 172, between lower metal layer 184 and upper metal layer 192, to/from any additional metal layers, etc., as needed to form the desired circuits.

In one implementation, one or both of the polarity sheets 112, 114 in FIGS. 5A and 6 is/are fabricated, prior to the process 110, using low-cost, gravure printing techniques. In other implementations, however, one or both of the polarity sheets 112, 114 is/are fabricated using other additive techniques, or even subtractive techniques such as photolithography. Generally, however, printing or other additive techniques are preferred in order to reduce costs (e.g., due to using less materials than subtractive methods).

The process 110 of FIG. 5A, and more generally the process 100 of FIG. 4, may be used in various different applications. As noted previously, the process 100 or the process 110 may be used to form C-OTFT circuits, or to form CMOS or inorganic complementary TFT circuits. The process 100 or the process 110 may be particularly useful in forming circuits for flexible electronics, printed electronics, or flexible displays. For example, the process 100 or the process 110 may be used to form driver circuits integrated on the backplane of a flexible display (e.g., using the same transistor technology as the pixel circuits), to form OLED pixel circuits in a flexible display, to form circuits for flexible memory displays, and/or to form virtually any other type of electronic circuit in a flexible display (e.g., display controller circuitry, and/or any other electronics required for a particular product with a display). It is understood, however, that the process 100 or the process 110 may also be used to form similar circuits in non-flexible displays, or to form other types of circuits in other, non-display applications, such as RFID tags, temperature sensors, etc.

The process 100 and/or the process 110 may provide various advantages. For example, the separate processing/fabrication of the two polarity sheets (e.g., the N-type sheet 112 and the P-type sheet 114 in FIG. 5A), prior to bonding the two polarity sheets, may reduce contamination of the materials (e.g., the N-type and P-type channel materials), and therefore improve yields, lower costs, and/or improve performance. As another example, the separate processing/fabrication of the two polarity sheets may permit the two polarity sheets to be separately and independently tested prior to bonding the two polarity sheets. By testing the polarity sheets separately, one polarity sheet can generally be preserved even if the opposite polarity sheet is defective, thereby improving yields and lowering costs. As yet another example, the separate fabrication of the two polarity sheets may permit a wider range of choice of materials, which may in turn improve performance and/or lower costs.

Figure 7:
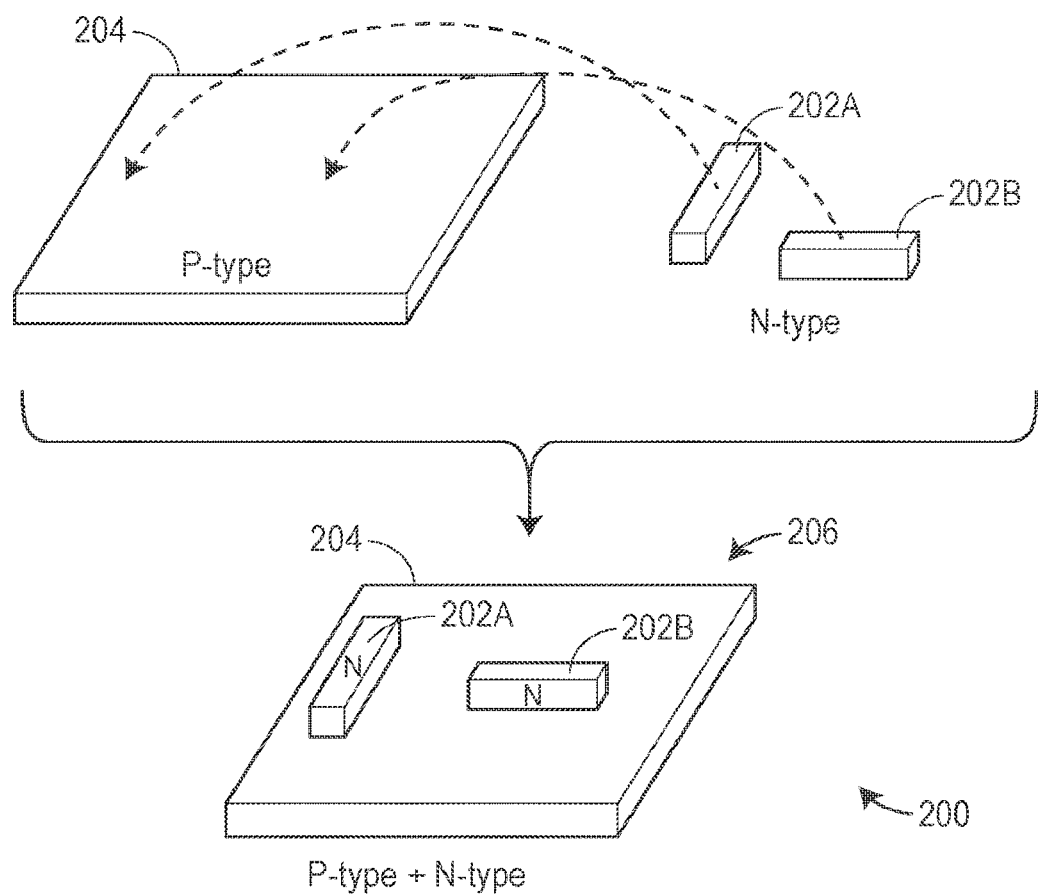
FIG. 7 depicts an example process for forming complementary circuitry in only select areas of a P-type sheet, according to one aspect of the present disclosure.

In some aspects of the invention, the yield with respect to sheets of one polarity may be further improved by dividing a single polarity sheet into multiple strips or pieces. FIG. 7 depicts, at a high level of generality, an example process 200 in which N-type strips 202A, 202B are bonded to a P-type sheet 204 to form a combined sheet 206. The N-type strips 202A, 202B may be obtained by cutting or otherwise dividing a larger N-type sheet not shown in FIG. 7 (e.g., N-type sheet 102 of FIG. 4 or N-type sheet 112 of FIG. 5A) into multiple pieces. The P-type sheet 204 may be the same as P-type sheet 104 of FIG. 4 or P-type sheet 114 of FIG. 5A, for example. The N-type strips 202A, 202B may be bonded to the P-type sheet 204 using an anisotropic conducting material such as ACG or ACF (not shown in FIG. 7). To save materials, the anisotropic conducting material may generally be applied only where the N-type strips 202A, 202B will contact the P-type sheet 204.

The technique of process 200 in FIG. 7 may be used, for example, when C-OTFT functionality is needed in only some portions of the combined sheet 206. For example, the technique may generally be suitable if most of the combined sheet 206 is dedicated to purely P-type OTFTs (e.g., for use as display pixels) and circuit connections, while only limited portions utilize C-OTFT driver circuitry. The appropriate interconnections to, from and between the various OTFT circuits may be provided by conductive tracks/traces on the P-type substrate 204, for example. While FIG. 7 depicts two, rectangular N-type strips 202A, 202B positioned on a P-type sheet 204, other implementations may utilize more or fewer N-type strips, and/or N-type pieces of other shapes (e.g., squares, circles, polygons, etc.). Moreover, the polarities may be reversed such that P-type strips or pieces are positioned on a larger, N-type sheet.

Using smaller pieces of one polarity generally leads to less wasted material for that polarity. For example, a defect in a small area on an N-type sheet may only require that one strip similar to N-type strip 202A or 202B be discarded, rather than discarding the entire sheet. Thus, as noted above, the use of smaller strips or pieces of one polarity may improve yields with respect to that polarity. This benefit is further discussed below in connection with FIG. 9. Moreover, using smaller pieces of one polarity can generally loosen registration/mounting tolerances when the pieces are bonded to the opposite polarity sheet. If the P-type sheet 204 and N-type strips 202A, 202B contain corresponding alignment markers, for example, the relatively small distances between the alignment markers and any metal areas that need to be aligned (i.e., metal areas on the P-type sheet 204 and N-type strips 202A, 202B that need to be electrically coupled via the anisotropic conducting material) will generally result in looser registration/alignment tolerances. Alignment markers, and related registration/alignment concerns, are discussed further below in connection with FIG. 12.

Figure 8:
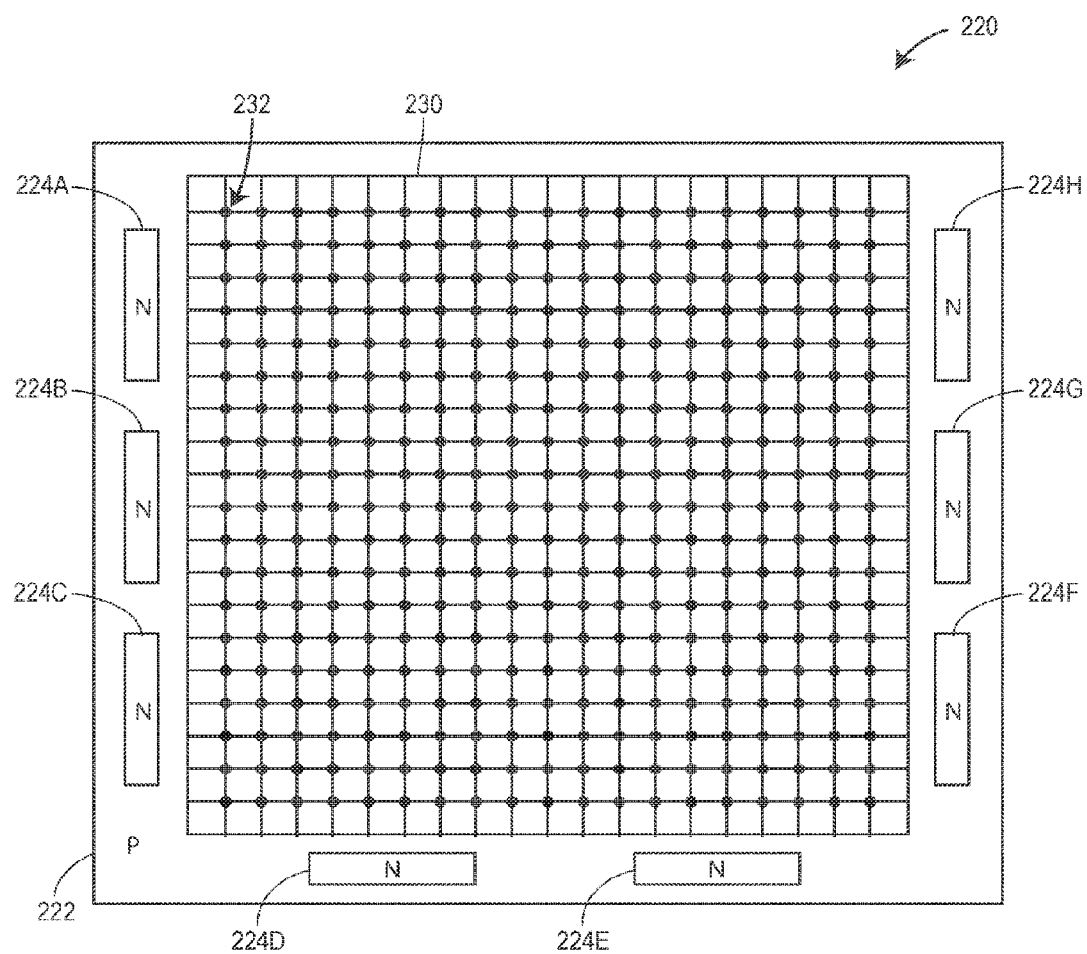
FIG. 8 depicts an example combined sheet that may be used to provide complementary circuitry in an electronic display, according to one aspect of the present disclosure.

The technique of FIG. 7 may provide additional benefits in applications where it is desired that the thickness of circuitry be minimized in particular areas. To illustrate, FIG. 8 depicts an example circuit that may be used in a thin display application (e.g., for a flexible display). In FIG. 8, an example combined sheet 220 includes a P-type sheet 222 to which are bonded a number of N-type strips 224A through 224H. The P-type sheet 222 and N-type strips 224A through 224H may generally have cross sections similar to those shown in FIG. 5A, and may be bonded together using anisotropic conducting material (e.g., ACG or ACF) in the manner shown in FIG. 6 to form a number of C-OTFT inverters.

Figure 3:
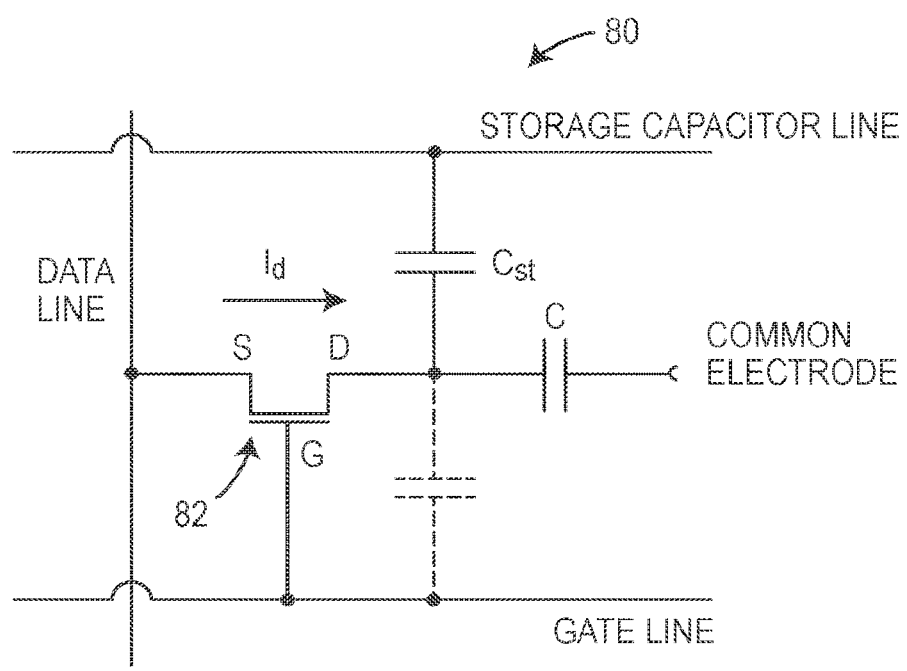
FIG. 3 depicts a typical pixel circuit.

The P-type sheet 222 includes an active matrix 230 that includes row and column electrodes. A pixel 232 of the display is located at each intersection of the row and column electrodes. Each pixel 232 may be associated with a pixel circuit such as the pixel circuit 80 of FIG. 3, for example, with the transistor of the pixel circuit 80 being a P-type OTFT formed on the P-type sheet 222. The active matrix 230 and the pixel circuits may be configured for any particular type of electronic display, such as a liquid crystal display (LCD), an electronic paper display (EPD), or an electrowetting display, for example. The C-OTFT inverters, formed where N-type OTFTs of the N-type strips 224A through 224H are vertically aligned with P-type OTFTs of the P-type sheet 222, may serve as drivers that energize the appropriate pixel circuits by activating the corresponding row and column electrodes. For clarity, FIG. 8 omits considerable detail in the combined sheet 220, such as the connections between the C-OTFT drivers and the active matrix 230, the connections between the electrodes of the active matrix 230 and the pixel circuits, and the pixel circuits themselves. These connections and circuits may all be included on the P-type sheet 222, if desired. It is understood that, in other implementations, the N-type strips 224A through 224H may be greater or fewer in number, some or all of the N-type strips 224A through 224H may have different, non-rectangular shapes, and/or the polarities of the P-type sheet 222 and N-type strips 224A through 224H may be reversed.

Using N-type strips 224A through 224H, rather than bonding the P-type sheet 222 to an equally large N-type sheet, may improve yields and alignment tolerances, as discussed above in connection with FIG. 7. Further, the thickness of the combined sheet 220 may be minimized in the area of the active matrix 230, and increased only in the peripheral areas where the N-type strips 224A through 224H are bonded to the P-type sheet 222. Controlling which areas do, and do not, have added thickness may be desirable for various reasons. With flexible displays, for example, the areas of extra thickness may be carefully designed so as to optimize mechanical properties affecting flexibility and/or ruggedness of the display.

Figure 9:
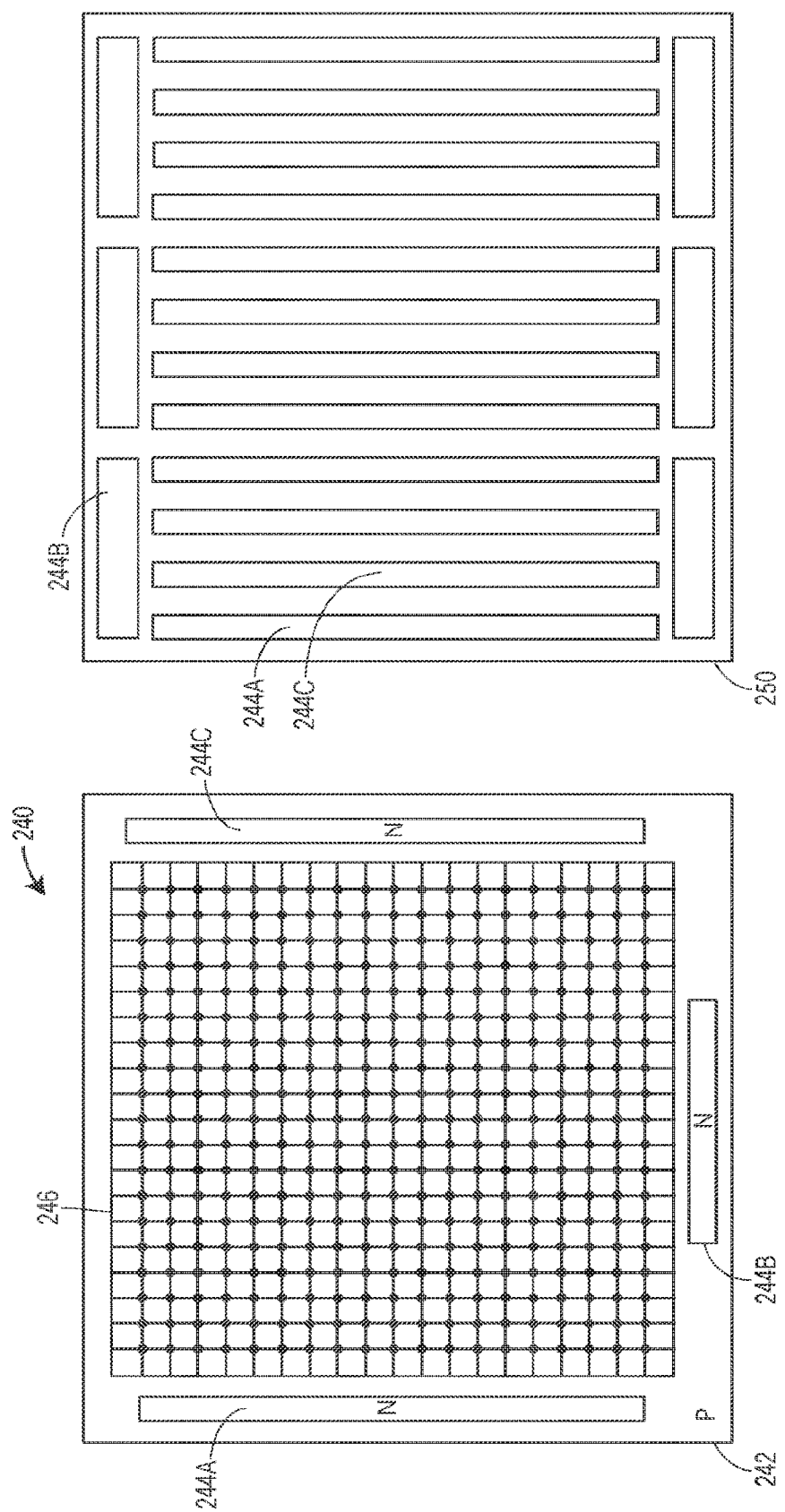
FIG. 9 depicts an example technique for further improving yield with respect to one of the two polarity sheets, according to one aspect of the present disclosure.

A specific example of how yields may be improved in a process for fabricating circuits for a thin (e.g., flexible) display is shown in FIG. 9. In FIG. 9, an example combined sheet 240 includes a P-type sheet 242 (e.g., similar to P-type sheet 222 of FIG. 8), to which are bonded N-type strips 244A through 244C (e.g., each similar to one of N-type strips 224A through 224H of FIG. 8, but having different dimensions). The P-type sheet 242 also includes an active matrix 246 (e.g., similar to active matrix 230 of FIG. 8), and the N-type strips 244A through 244C are bonded to the P-type sheet 242 using an anisotropic conducting material such as ACG or ACF so as to form C-OTFT drivers for the pixel circuits of the active matrix 246.

Also shown in FIG. 9 is an N-type sheet 250, on which circuits for a plurality of N-type strips (including the N-type strips 244A through 244C) are fabricated prior to forming the combined sheet 240. By densely positioning the N-type strips on the N-type sheet 250, a large number of N-type strips may be fabricated (in this example, enough N-type strips to form six combined sheets similar to combined sheet 240). In some implementations, the functionality of each of the N-type strips on the N-type sheet 250 is tested before bonding any of the N-type strips to P-type sheets. This testing may occur before cutting the N-type strips out of the N-type sheet 250, or after. If a particular N-type strip on the N-type sheet 250 does not satisfy test requirements, that strip may be discarded, and another strip from the N-type sheet 250 that does satisfy the test requirements may be used in its place. Generally, the failure of one or more individual N-type strips will not require that the entire N-type sheet 250 be discarded. Accordingly, yields for the materials used to form N-type sheets may be improved, and material costs reduced. In implementations where the polarities of the sheets 242, 250 are reversed, yields for the materials used to form P-type sheets may instead be improved.

Figure 10:
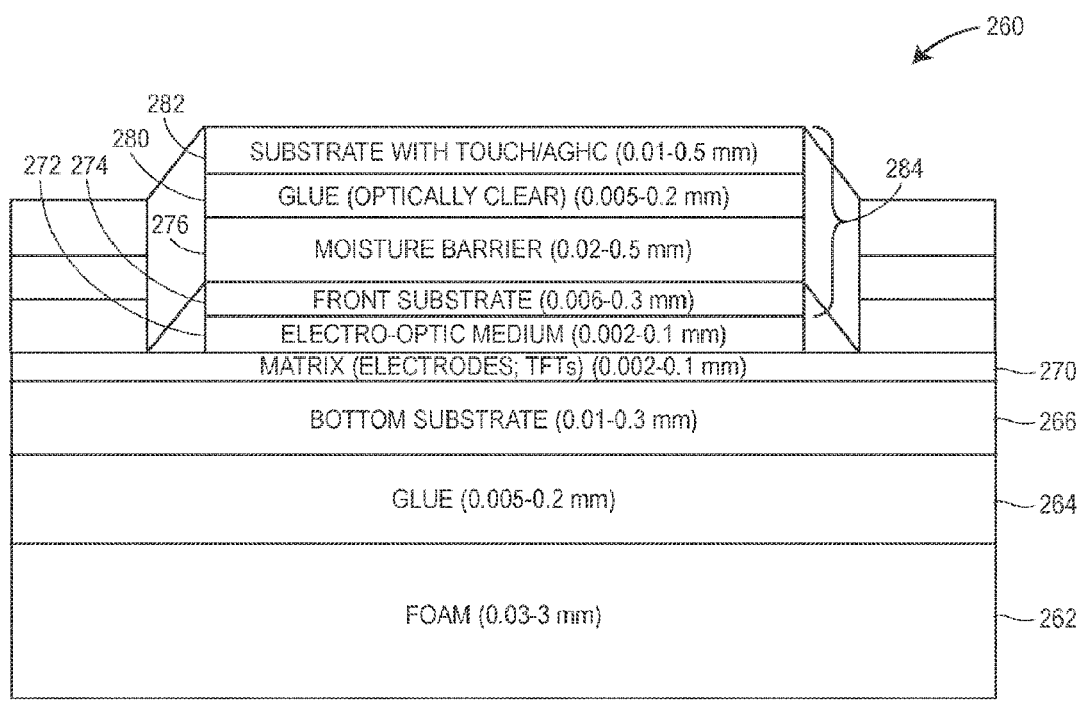
FIG. 10 depicts an enlarged, cross-sectional view of a typical flexible display stack.

In some aspects of the present invention, material costs are decreased by using, for at least one of the two polarity sheets, a substrate that has one or more additional functions. That is, a substrate may not only provide a substrate layer for fabricating a particular polarity sheet, but also serve one or more other purposes. For instance, the substrate of one polarity sheet may also serve as a particular layer in a flexible display stack. A cross-section of an example flexible display stack 260 is shown in FIG. 10. The flexible display stack 260 includes a foam layer 262, a glue layer 264, a bottom substrate 266, a matrix layer 270, an electro-optic medium 272, a front substrate 274, a moisture barrier 276, another, optically clear glue layer 280, and a touch sensor substrate 282. The layers 274, 276, 280 and 282 are sometimes collectively referred to as a "top substrate," shown in FIG. 10 as top substrate 284.

The foam layer 262 may be a relatively thick layer of foam having viscoelastic properties, and a very low stiffness when the foam layer 262 is flexed slowly. The stiffness of the foam in the foam layer 262 may increase when the foam is indented at a high speed. In this manner, the foam layer 262 generally protects the display from impact, and effectively spreads impacts over a larger area, while at the same time having only a minimal effect on display flexibility. The matrix layer 270 may contain the electrodes and TFTs of an active display matrix, such as the active matrix 230 of FIG. 8, for example. The moisture barrier 276 generally protects the display, including the matrix layer 270, from moisture damage. The touch sensor substrate 282 may include an anti-glare hard coat (AGHC) layer. In other implementations, the flexible display stack 260 may include more, fewer or different layers than those shown in FIG. 10, and/or some of the layers may be arranged in a different order. For example, the moisture barrier 276 may be omitted, the substrate 284 may not be a touch sensor substrate and/or may not include an AGHC layer, the layer thicknesses may be outside of the numerical ranges shown in FIG. 10, and so on.

In one aspect of the invention, the substrate of one of the polarity sheets also serves as at least the moisture barrier 276 of the flexible display stack 260. For example, the substrate 120 of the N-type sheet 112 of FIG. 5A may also serve as the moisture barrier 276. In another aspect of the invention, the substrate of one of the polarity sheets also serves as at least the touch sensor substrate 282 of the flexible display stack 260. For example, the substrate 120 of the N-type sheet 112 of FIG. 5A may also serve as the touch sensor substrate 282.

Figure 11:
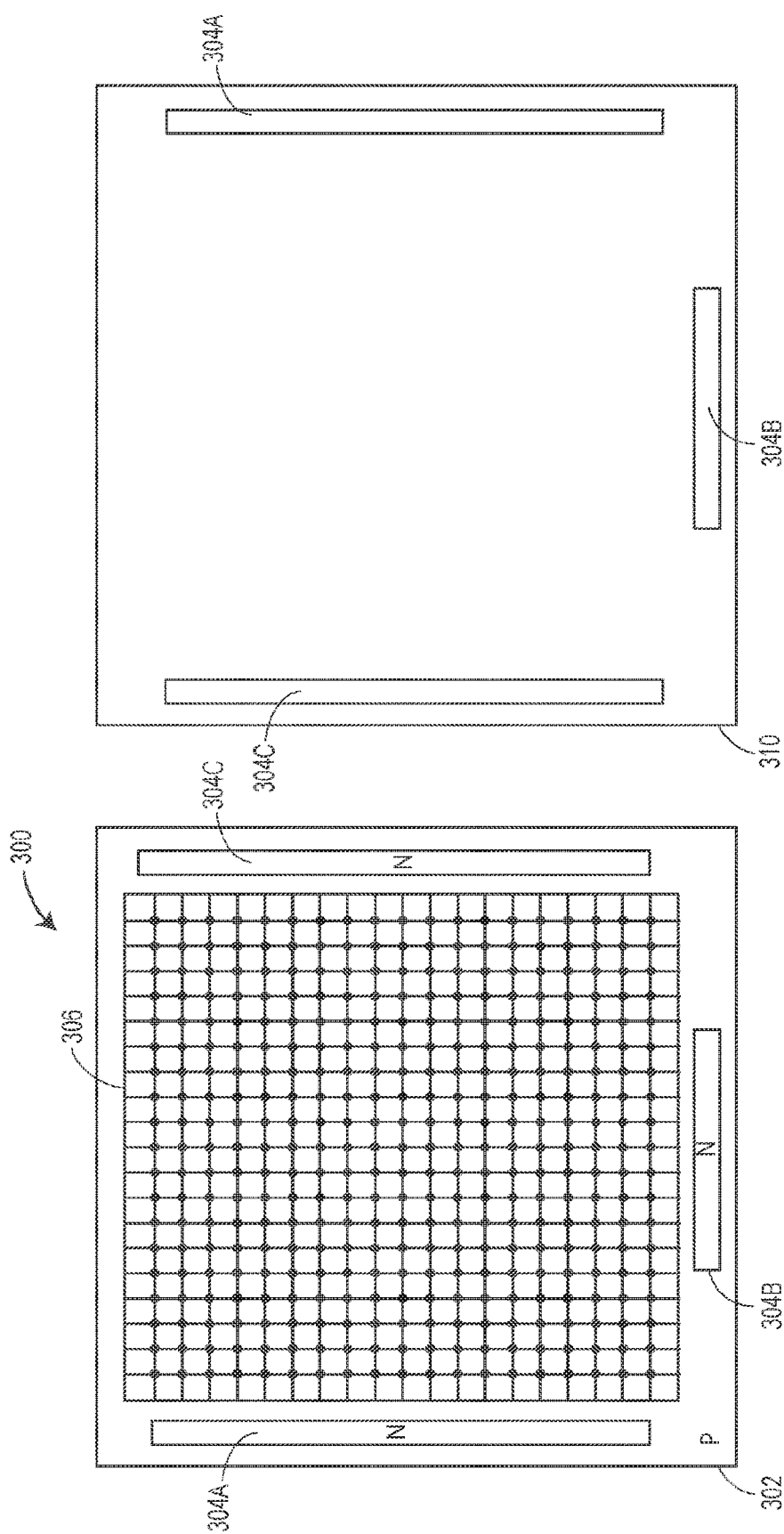
FIG. 11 depicts an example technique for further reducing material costs and/or circuit thickness, according to one aspect of the present disclosure.

A specific example of how one of the polarity substrates may have dual functionality within a flexible display is shown in FIG. 11. In FIG. 11, an example combined sheet 300 includes a P-type sheet 302 (e.g., similar to P-type sheet 222 of FIG. 8), to which are bonded N-type strips 304A through 304C (e.g., each similar to one of N-type strips 224A through 224H of FIG. 8, but having different dimensions). The P-type sheet 302 also includes an active matrix 306 (e.g., similar to active matrix 230 of FIG. 8), and the N-type strips 304A through 304C are bonded to the P-type sheet 302 using an anisotropic conducting material such as ACG or ACF so as to form C-OTFT drivers for the pixel circuits of the active matrix 306.

Also shown in FIG. 11 is an N-type sheet 310, on which circuits for a plurality of N-type strips (including the N-type strips 304A through 304C) are fabricated prior to forming the combined sheet 300. Unlike the N-type sheet 250 of FIG. 9, however, N-type strips are not densely positioned on the N-type sheet 310. Rather, the N-type sheet 310 includes only enough N-type strips for the single combined sheet 300, with the N-type strips 304A through 304C being positioned such that, when the entire N-type sheet 310 is bonded to the P-type sheet 302, the combined sheet 300 results. The P-type sheet 302 and the N-type sheet 310 may be similar to the P-type sheet 114 and the N-type sheet 112, respectively, of FIG. 5.

In this aspect of the invention, the substrate of the N-type sheet 310 (e.g., substrate 120 of FIG. 5A) is formed of a material that is also suitable for use as another layer of a display stack. For example, the substrate material may be suitable for use as an environmental (e.g., moisture) barrier or a touch sensor substrate, such as the moisture barrier 276 or the touch sensor substrate 282 of FIG. 10. For a touch sensor, for example, the substrate may be a PET plastic or glass substrate with one or two layers of transparent conductive patterns (e.g., ITO, carbon nanotubes, or silver nanowires). The touch sensor substrate may include the layers needed to detect touches, wiring or traces routed to a position where an FPC can be bonded, etc. Alternatively, the connections of the touch sensor could be brought to the sheet 310 by anisotropic conductive material (e.g., ACF) bonding. As another example, the substrate may form a front light. For instance, the substrate may include a thin plastic sheet with embossed structures on it that disrupt total internal reflection of the light inside the front light, and direct that light towards the display. In some implementations, the substrate of the N-type sheet 310 is configured or fabricated to have its other functionality (e.g., environmental barrier, touch sensor, front light, etc.) even prior to the bonding of the two sheets 302, 310.

By adding extra functionality to the substrate of the N-type sheet 310 in this manner, material costs may be lowered. In some aspects of the invention, an even higher level of integration, and potential cost savings, may be achieved. In an implementation where the substrate of the N-type sheet 310 is a touch sensor substrate, for example, the substrate may also incorporate a multiplexer for a touch sensor of the touch screen.

Because the present invention involves bonding two polarity sheets together, and because the various metal areas or pads on those polarity sheets must be aligned to form the desired electrical connections (via the anisotropic conducting material), it is important that the two polarity sheets be precisely registered with each other prior to bonding. As noted above, tolerances may be relaxed somewhat where smaller pieces of one polarity (e.g., N-type strips) are bonded to the other polarity sheet. However, larger polarity sheets, and particularly larger polarity sheets that are flexible, may have less dimensional stability, which can further complicate alignment of the polarity sheets.

Figure 12:
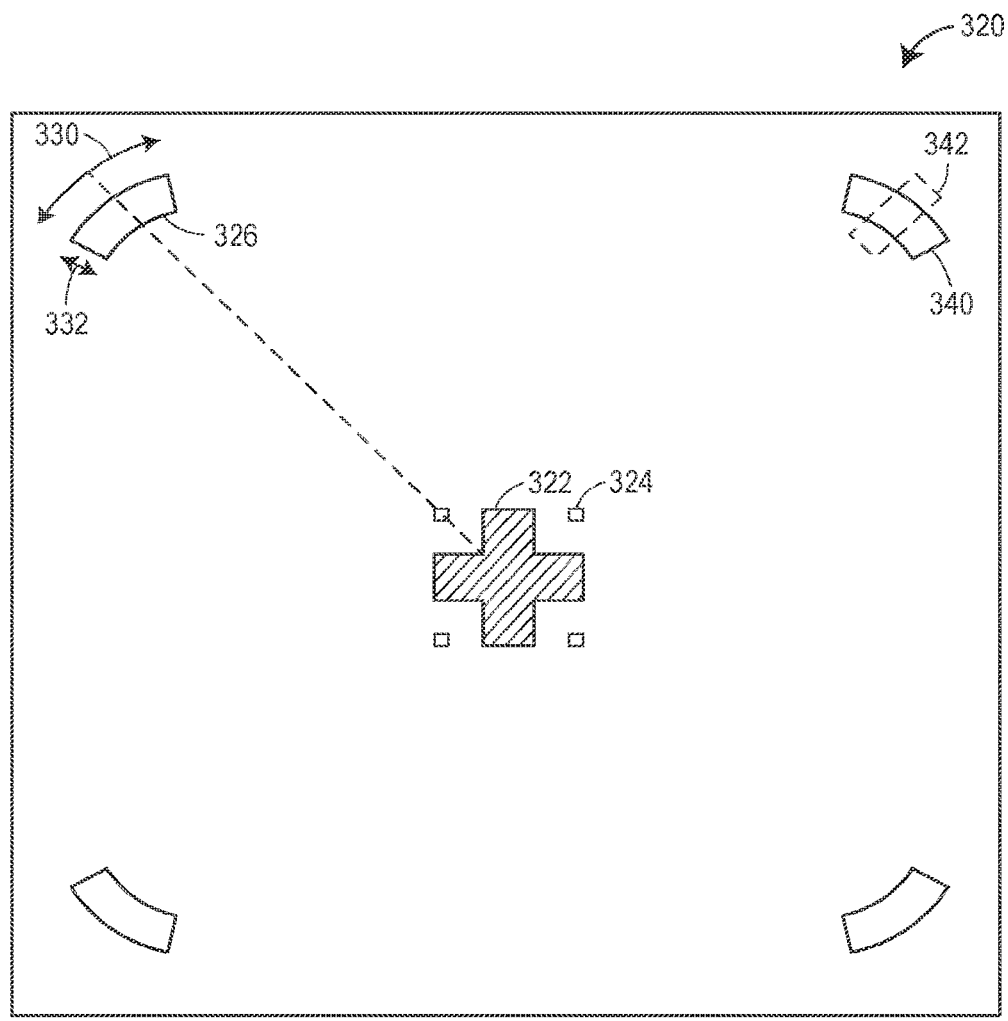
FIG. 12 depicts example techniques for aligning the two polarity sheets and/or relaxing alignment tolerances, according to one aspect of the present disclosure.

FIG. 12 shows an example polarity sheet 320 that utilizes techniques for properly aligning two polarity sheets, and relaxing alignment tolerances, according to one aspect of the invention. The polarity sheet 320 may be similar to the N-type sheet 112 or the P-type sheet 114 of FIG. 5A, for example. The polarity sheet 320 includes an alignment marker 322, which may be printed on the side of the polarity sheet 320 that faces the opposite polarity sheet during bonding using a non-conductive ink or other material, for example. The alignment marker 322 may be at the center of the polarity sheet 320, or at another location on the polarity sheet 320, and may be the shape and relative size shown in FIG. 12 or another shape and/or relative size. In some implementations, multiple alignment markers are placed on the polarity sheet 320 and used for alignment. While not shown in FIG. 12, the opposite polarity sheet (i.e., the sheet to which the polarity sheet 320 is to be bonded) may have a mirror image of the alignment marker 322, on the exterior of the opposite polarity sheet. The alignment marker 320, and the corresponding alignment marker on the opposite polarity sheet, may then be used to optically align at least one point in both position and angle (e.g., when using an XY table to align the sheets).

As the distance from the alignment marker 322 increases, larger shifts in position and angle may be present (e.g., due to dimensional instability of the substrate, and because even the alignment at the alignment marker 322 is not perfect). To take theses positional/angular shifts into account, the metal contact areas may generally be made larger as the distance of those contact areas from the alignment marker 322 increases. An example of this is illustrated in FIG. 12, where a first metal contact area 324 relatively close to the alignment marker 322 is made smaller than a second metal contact area 326 relatively far from the alignment marker 322. The larger size of the metal contact area 326 is intended, in one direction, to account for possible shifts in a lateral position or angle (represented in FIG. 12 as the range 330), and in an orthogonal direction to account for possible shifts in distance from the alignment marker 322 (represented in FIG. 12 as the range 332). In the example implementation of FIG. 12, the further metal contact area 326 is also curved to account for possible shifts in angle. In other implementations, however, metal contact areas are not curved. All of the metal contact areas on the polarity sheet 320 shown in FIG. 12 may be included on a top metal layer of the polarity sheet 320, such as upper metal layer 132 or upper metal layer 152 of FIG. 5A (or additional metal layers not shown in FIG. 5A), for example.

FIG. 12 also illustrates another technique that may be used to relax alignment tolerances. In implementations where at least some metal contact areas—and particularly those contact areas further from the alignment marker 322—are longer in one dimension than in another, the corresponding metal contact areas on the opposite polarity sheet may be substantially orthogonal to the metal contact areas when brought into a face-to-face relation (i.e., when the polarity sheets are bonded together). For the metal contact area 340 of the polarity sheet 320, for example, the opposite polarity sheet (not shown in FIG. 12) may include a corresponding metal contact area 342. The arrangement of the metal contact area 342 relative to the metal contact area 340 shown in FIG. 12 reflects the relative positions/angles of the two metal contact areas 340, 342 when the polarity sheet 320 is brought into contact with the opposite polarity sheet for bonding. In some implementations, only contact areas further away from the alignment marker 322 are positioned in an orthogonal relation. Moreover, in some alternative implementations, the contact areas (e.g., metal contact areas 340 and 342) are positioned at a relative angle other than 90 degrees (e.g., 45 degrees, 60 degrees, etc.) when the two polarity sheets are brought together for bonding.

Figure 13:
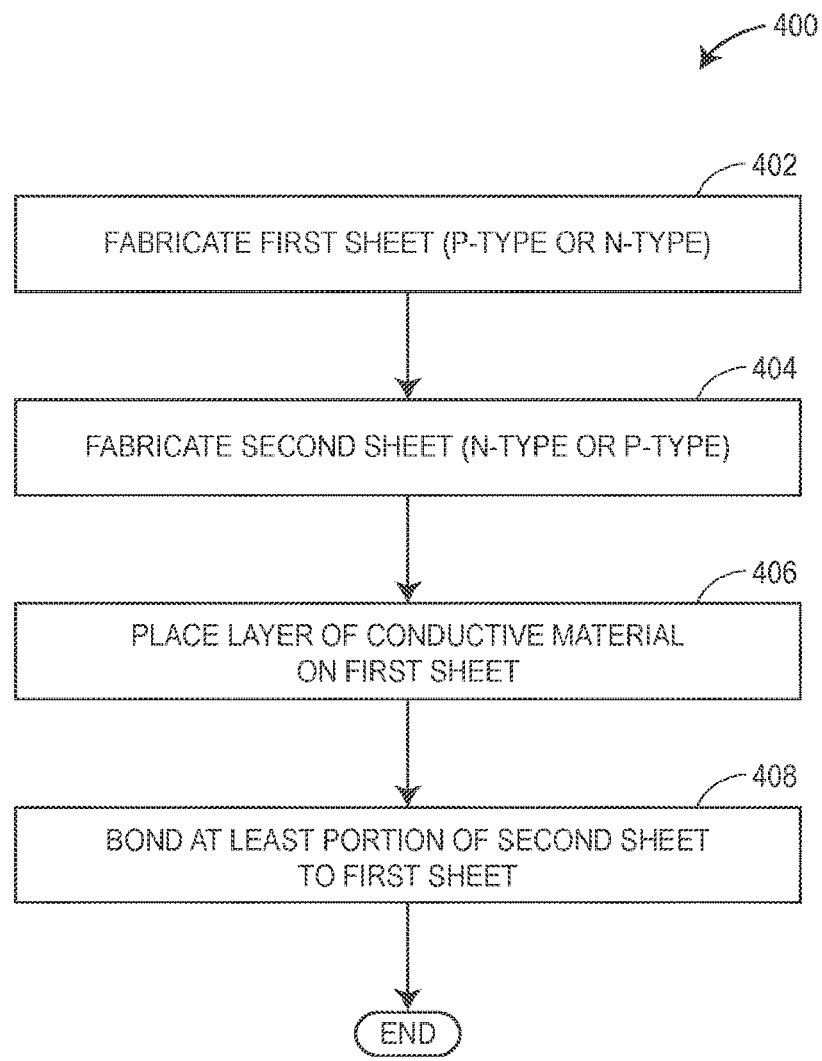
FIG. 13 is a flow diagram depicting an example method for fabricating at least a portion of a complementary circuit, according to one aspect of the present disclosure.

FIG. 13 is a flow diagram of an example method 400 for fabricating at least a portion of a complementary circuit, according to particular aspects of the present invention. The method 400 may correspond to one or more of the aspects and/or implementations discussed above in connection with FIGS. 4-13, for example. In the method 400, a first sheet is fabricated (block 402). The first sheet is fabricated such that the sheet includes a first substrate, a first lower metal layer, a first upper metal layer, a first dielectric layer disposed between the first lower metal layer and the first upper metal layer, and a first semiconductor channel layer. The first lower metal layer, the first upper metal layer, the first dielectric layer and the first semiconductor channel layer are configured so as to form a first plurality of transistors. The first sheet may also include one or more additional layers, such as a planarization layer between the first substrate and the first lower metal layer, and/or one or more additional dielectric layers and metal layers on top of the first upper metal layer, for example. The first plurality of transistors is either a plurality of P-type transistors or a plurality of N-type transistors (e.g., P-type or N-type OTFTs).

The first sheet is fabricated such that the first lower metal layer forms a drain and a source for each of the first plurality of transistors, and such that the first upper metal layer forms a gate for each of the first plurality of transistors (top gate). Alternatively, the first sheet may be fabricated such that the first lower metal layer forms a gate for each of the first plurality of transistors, and such that the first upper metal layer forms a drain and a source for each of the first plurality of transistors (bottom gate). The first sheet may be similar to the N-type sheet 112 or the P-type sheet 115 of FIG. 5A, or one of sheets 160, 170, 180 of FIGS. 5B-5D, for example.

Also in the method 400, a second sheet is fabricated (block 404). The second sheet is fabricated such that the sheet includes a second substrate, a second lower metal layer, a second upper metal layer, a second dielectric layer disposed between the second lower metal layer and the second upper metal layer, and a second semiconductor channel layer. The second lower metal layer, the second upper metal layer, the second dielectric layer and the second semiconductor channel layer are configured so as to form a second plurality of transistors. The second sheet may also include one or more additional layers, such as a planarization layer between the second substrate and the second lower metal layer, and/or one or more additional dielectric layers and metal layers on top of the second upper metal layer, for example. The second plurality of transistors is either a plurality of N-type transistors or a plurality of P-type transistors (e.g., N-type or P-type OTFTs). In particular, if the first plurality of transistors in the first sheet are P-type transistors, the second plurality of transistors are N-type transistors. Conversely, if the first plurality of transistors in the first sheet are N-type transistors, the second plurality of transistors are P-type transistors. In one implementation, the first plurality of transistors are OTFTs, while the second plurality of transistors are inorganic TFTs (e.g., amorphous Silicon (a-Si) transistors). Alternatively, the first plurality of transistors and the second plurality of transistors may both include organic TFTs, or both include inorganic TFTs, etc.

The second sheet is fabricated such that the second lower metal layer forms a drain and a source for each of the second plurality of transistors, and such that the second upper metal layer forms a gate for each of the second plurality of transistors (top gate). Alternatively, the second sheet may be fabricated such that the second lower metal layer forms a gate for each of the second plurality of transistors, and such that the second upper metal layer forms a drain and a source for each of the second plurality of transistors (bottom gate). The second sheet may be similar to the P-type sheet 114 (if the first sheet is similar to N-type sheet 112) or the N-type sheet 112 (if the first sheet is similar to P-type sheet 114) of FIG. 5A, or one of sheets 160, 170, 180 of FIGS. 5B-5D, for example.

The first and second sheets may be fabricated independently of each other, and each may use a printing process such as gravure printing, a photolithographic process, or another suitable fabrication technique. In some implementations, multiple fabrication techniques are used for one or both sheets. In one implementation where a "top gate" configuration is desired, for example, one or both sheets may be fabricated by first using a higher-resolution photolithographic process for the lower metal layer that includes the drains and sources, and then using a lower-resolution printing process for the upper metal layer that includes the gates.

The first and second sheets may also be tested independently of each other after fabrication (e.g., prior to block 408, and preferably prior to block 406, both discussed below) to detect defects. In some aspects of the invention, the method 400 includes an additional block (not shown in FIG. 13) in which the second sheet is cut into a plurality of strips or pieces prior to at least block 408. In these aspects, testing of the second sheet may occur before or after cutting the second sheet into strips. Each strip of the second sheet may bear any suitable size relation to the size of the first sheet (e.g., half the size of the first sheet, one-tenth the size, etc.). While the second sheet may be cut into multiple strips or pieces, it is noted that the second sheet may itself be a strip or piece of a larger sheet.

The first and/or second sheet may include transistors (of the respective polarity) and/or circuit traces as needed to form the desired circuits. For example, the first sheet may be fabricated so as to include an active display matrix (e.g., for a flexible display) with a plurality of pixel circuits and electrodes. In one such implementation, the first plurality of transistors and the second plurality of transistors discussed in connection with blocks 402 and 404 are used to form (after the bonding at block 408, discussed below) integrated driver circuits that have a complementary circuit topology. Generally, many other types of circuitry may also, or instead, be fabricated on the first and/or second sheets.

In some implementations, the first sheet fabricated at block 402, and/or the second sheet fabricated at block 404, may include a respective environmental barrier, with the two barriers being arranged so as to seal substantially an entirety of both sheets when the two sheets are bonded together at block 408 (discussed below). The sheets may be affixed to the environmental barriers, for example, or one or both of the first and the second substrate may also function as an environmental barrier. In other implementations, the first or second substrate is a touch sensor substrate, or a front light, etc.

After the fabrication of at least the first sheet, a layer of conductive material (e.g., an anisotropic conducting material such as ACG or ACF) is placed on the first sheet (block 406). The conductive material may or may not cover the entire first sheet. If the second sheet is cut into strips (or if the second sheet itself is appreciably smaller than the first sheet), for example, then the conductive material may optionally be placed only in those areas where one or more strips of the second sheet (or the smaller sheet itself) is/are to be bonded to the first sheet. In some implementations, the layer of conductive material includes a conductive adhesive material embedded in a non-conductive adhesive material. In other implementations, the layer of conductive material includes a conductive non-adhesive material embedded in a non-conductive adhesive material.

After the fabrication of the first and second sheets, and after the layer of conductive material is placed on the first sheet, at least a portion of the second sheet is bonded to the first sheet (block 408). The two sheets are bonded such that the layer of conductive material is disposed between and in contact with a first top metal layer and a second top metal layer. The first top metal layer is either the first upper metal layer described above, or is a different layer of the first sheet that is electrically coupled to one or more areas of the first upper metal layer (and possibly also the first lower metal layer, etc.) and is separated from the first upper metal layer at least by a first set of one or more additional dielectric layers. Similarly, the second top metal layer is either the second upper metal layer described above, or is a different layer of the second sheet that is electrically coupled to one or more areas of the second upper metal layer (and possibly also the second lower metal layer, etc.) and is separated from the second upper metal layer at least by a second set of one or more additional dielectric layers. The two sheets are also bonded such that the layer of conductive material provides electrically conducting paths between areas of metal on the first top metal layer and areas of metal on the second top metal layer that are vertically aligned with the areas of metal on the first top metal layer. Block 408 may include applying the appropriate amount of pressure, temperature, and/or ultraviolet light intensity (e.g., each within some predetermined range), for the appropriate amount of time, to fix the sheets together via the layer of conductive material.

Generally, block 408 also includes an alignment process prior to applying the appropriate pressure, temperature, etc. In implementations where one or more inverters with a complementary circuit topology are desired, and where each sheet includes transistors in a "top gate" configuration, the alignment process may align at least the portion of the second sheet to the first sheet such that, after bonding, the conductive material electrically couples the gate and a bonding pad of each of at least some of the first plurality of transistors to the gate and a bonding pad, respectively, of a corresponding one of the second plurality of transistors. The bonding pads may be electrically coupled to the drains of the respective sheets by way of metal vias through the dielectric layers, for example.

In implementations where the second sheet is cut into a plurality of strips, block 408 may include bonding each of one or more of those strips to the first sheet with the proper alignment(s). Regardless of whether the full second sheet, or only strips of the second sheet, is/are bonded to the first sheet, the alignment process may include aligning (e.g., optically aligning) a first alignment marker on the first sheet with a second alignment marker on the second sheet. To relax alignment tolerances, the metal bonding pads/contacts on the first and second top metal layers may generally increase in size as distance from the alignment markers increases. Alternatively, or additionally, some or all of the metal bonding pads/contacts formed on the first and second top metal layers may be positioned at an angular offset relative to each other (e.g., 90 degrees) to relax alignment tolerances.

Although the examples described in detail above in connection with the figures are directed primarily to flexible electronic displays, the features, processes and arrangements described herein may generally be used for non-flexible displays, and for other flexible or non-flexible types of electronics. Additional arrangements, processes, combinations of features, and/or advantages of the invention are contemplated within the scope of the claims appended hereto.

What is claimed:

1. A method for fabricating at least a portion of a display apparatus, the method comprising:
fabricating a first sheet comprising a first substrate, a first lower metal layer, a first upper metal layer, a first dielectric layer disposed between the first lower metal layer and the first upper metal layer, and a first semiconductor channel layer,
   wherein the first lower metal layer, the first upper metal layer, the first dielectric layer and the first semiconductor channel layer are configured so as to form a first plurality of transistors,
   wherein the first plurality of transistors is one of (i) a plurality of P-type transistors or (ii) a plurality of N-type transistors,
   wherein either the first lower metal layer forms a drain and a source for each of the first plurality of transistors and the first upper metal layer forms a gate for each of the first plurality of transistors, or the first lower metal layer forms a gate for each of the first plurality of transistors and the first upper metal layer forms a drain and a source for each of the first plurality of transistors, and
   wherein the first plurality of transistors includes (i) transistors of an active matrix that includes row and column electrodes, with intersections of the row and column electrodes corresponding to pixel circuits of the display apparatus, and (ii) transistors of drivers of the pixel circuits;
fabricating a second sheet comprising a second substrate, a second lower metal layer, a second upper metal layer, a second dielectric layer disposed between the second lower metal layer and the second upper metal layer, and a second semiconductor channel layer,
   wherein the second lower metal layer, the second upper metal layer, the second dielectric layer and the second semiconductor channel layer are configured so as to form a second plurality of transistors,
   wherein the second plurality of transistors is the other one of (i) the plurality of P-type transistors or (ii) the plurality of N-type transistors, and
   wherein either the second lower metal layer forms a drain and a source for each of the second plurality of transistors and the second upper metal layer forms a gate for each of the second plurality of transistors, or the second lower metal layer forms a gate for each of the second plurality of transistors and the second upper metal layer forms a drain and a source for each of the second plurality of transistors;
after fabricating the second sheet, cutting at least a portion of the second sheet into a plurality of strips each containing at least some of the second plurality of transistors;
bonding at least the portion of the second sheet to the first sheet such that
   a layer of conductive material is disposed between and in contact with a first top metal layer and a second top metal layer, the first top metal layer being either (i) the first upper metal layer or (ii) a different layer of the first sheet that is electrically coupled to one or more areas of at least the first upper metal layer and is separated from the first upper metal layer at least by a first set of one or more additional dielectric layers, and the second top metal layer being either (i) the second upper metal layer or (ii) a different layer of the second sheet that is electrically coupled to one or more areas of at least the second upper metal layer and is separated from the second upper metal layer at least by a second set of one or more additional dielectric layers,
   the layer of conductive material provides electrically conducting paths between (i) areas of metal on the first top metal layer and (ii) areas of metal on the second top metal layer that are vertically aligned with the areas of metal on the first top metal layer,
   the plurality of strips are arranged around a perimeter of the active matrix, and
   at least some transistors of the plurality of strips form complementary circuits with the transistors of the drivers of the pixel circuits.

2. The method of claim 1, wherein the layer of conductive material does not provide electrically conducting paths between (i) the areas of metal on the first top metal layer and (ii) any areas of metal on the second top metal layer that are not vertically aligned with the areas of metal on the first top metal layer.

3. The method of claim 1, wherein the first plurality of transistors and the second polarity of transistors collectively include a plurality of opposite-polarity transistor pairs, and wherein bonding at least the portion of the second sheet to the first sheet comprises:
aligning at least the portion of the second sheet to the first sheet such that, after bonding, and for each of the plurality of opposite-polarity transistor pairs, the layer of conductive material electrically couples one or more of the gate, the drain and the source of one of the first plurality of transistors to one or more of the gate, the drain and the source of a corresponding one of the second plurality of transistors.

4. The method of claim 1, wherein:
fabricating the first sheet includes forming a first plurality of metal vias, each of the first plurality of metal vias either (i) if the first lower metal layer forms the drains and the sources for the first plurality of transistors, electrically coupling one or both of the drain and the source for a respective one of the first plurality of transistors to one or two respective bonding pads on the first upper metal layer, or (ii) if the first lower metal layer forms the gates for the first plurality of transistors, electrically coupling the gate for a respective one of the first plurality of transistors to a respective bonding pad on the first upper metal layer; and
fabricating the second sheet includes forming a second plurality of metal vias, each of the second plurality of metal vias either (i) if the second lower metal layer forms the drains and the sources for the second plurality of transistors, electrically coupling one or both of the drain and the source for a respective one of the second plurality of transistors to one or two respective bonding pads on the second upper metal layer, or (ii) if the second lower metal layer forms the gates for the second plurality of transistors, electrically coupling the gate for a respective one of the second plurality of transistors to a respective bonding pad on the second upper metal layer.

5. The method of claim 1, wherein:
the first top metal layer is the first upper metal layer; and
the second top metal layer is the second upper metal layer.

6. The method of claim 1, wherein the first top metal layer is the different layer of the first sheet that is electrically coupled to one or more areas of at least the first upper metal layer and is separated from the first upper metal layer at least by the first set of additional dielectric layers.

7. The method of claim 1, wherein:
the first lower metal layer forms a gate for each of the first plurality of transistors and the first upper metal layer forms a drain and a source for each of the first plurality of transistors; and
the second lower metal layer forms a gate for each of the second plurality of transistors and the second upper metal layer forms a drain and a source for each of the second plurality of transistors.

8. The method of claim 1, wherein:
the first lower metal layer forms a drain and a source for each of the first plurality of transistors and the first upper metal layer forms a gate for each of the first plurality of transistors; and the second lower metal layer forms a drain and a source for each of the second plurality of transistors and the second upper metal layer forms a gate for each of the second plurality of transistors.

9. The method of claim 1, further comprising:
after cutting at least the portion of the second sheet into the plurality of strips, but prior to bonding the at least one of the plurality of strips to the first sheet, testing the at least one of the plurality of strips to detect defects.

10. The method of claim 1, further comprising:
after fabricating the first sheet, but prior to bonding at least the portion of the second sheet to the first sheet, testing the first sheet to detect defects; and
after fabricating the second sheet, but prior to bonding at least the portion of the second sheet to the first sheet, testing the second sheet to detect defects.

11. The method of claim 1, wherein:
the first plurality of transistors is one of (i) a plurality of P-type organic thin film transistors (TFTs) or (ii) a plurality of N-type organic TFTs; and
the second plurality of transistors is the other one of (i) the plurality of P-type organic TFTs or (ii) the plurality of N-type organic TFTs.

12. The method of claim 1, wherein:
the first plurality of transistors includes one of (i) a plurality of organic thin film transistors (TFTs) or (ii) a plurality of inorganic TFTs; and
the second plurality of transistors includes the other one of (i) the plurality of organic TFTs or (ii) the plurality of inorganic TFTs.

13. The method of claim 12, wherein:
the plurality of organic TFTs includes a plurality of P-type organic TFTs; and
the plurality of inorganic TFTs includes a plurality of amorphous Silicon (a-Si) transistors.

14. The method of claim 1, wherein:
the layer of conductive material comprises anisotropic conducting material.

15. The method of claim 14, wherein:
the layer of anisotropic conducting material comprises anisotropic conducting glue (ACG) or anisotropic conducting foil (ACF).

* * * * *